US006539331B1

(12) United States Patent
Fiekowsky

(10) Patent No.: US 6,539,331 B1
(45) Date of Patent: Mar. 25, 2003

(54) MICROSCOPIC FEATURE DIMENSION MEASUREMENT SYSTEM

(76) Inventor: Peter J. Fiekowsky, 952 S. Springer Rd., Los Altos, CA (US) 94024

( * ) Notice: Subject to any disclaimer, the term of this patent is extended or adjusted under 35 U.S.C. 154(b) by 113 days.

(21) Appl. No.: 09/657,920

(22) Filed: Sep. 8, 2000

(51) Int. Cl.[7] .............................................. G03B 27/42
(52) U.S. Cl. ....................... 702/159; 250/548; 359/629; 702/95; 716/21
(58) Field of Search .................. 702/95, 159; 356/237, 356/241, 429, 430, 431; 355/53, 67, 68, 69, 71; 250/563, 559.42, 559.48, 559.49, 560, 572; 430/5

(56) References Cited

U.S. PATENT DOCUMENTS

| | | | | |
|---|---|---|---|---|
| 5,294,803 A | * | 3/1994 | Pahr | 250/561 |
| 5,614,990 A | | 3/1997 | Bruce et al. | 355/71 |
| 5,633,735 A | * | 5/1997 | Hunter, Jr. et al. | 359/15 |
| 5,804,336 A | | 9/1998 | Rolfon | 430/5 |
| 5,862,058 A | * | 1/1999 | Samuels et al. | 716/21 |
| 5,966,677 A | | 10/1999 | Fiekowsky | 702/95 |
| 5,994,711 A | * | 11/1999 | Seachman et al. | 250/559.36 |
| 6,167,355 A | * | 12/2000 | Fiekowsky | 702/159 |
| 6,178,360 B1 | * | 1/2001 | Pierrat et al. | 700/121 |
| 6,181,474 B1 | * | 1/2001 | Ouderkirk et al. | 359/629 |
| 6,271,535 B1 | * | 8/2001 | Seachman et al. | 250/548 |

OTHER PUBLICATIONS

George et al., "A Practical and Precise Method for Mask Defect Size Measurement", Mar. 10, 1996, Proceedings of the SPIE Conference on Photo–lithography.
Stocker, et al., Characterisation of Defect Sizing on An automatic Inspection Station "(KLA238e)", 1993, SPIE vol. 2087 Photomask Technology and Management.
Kawahira, et al., Semi Standards Programmed Defect masks and Its Applications for Defect Inspection, SEMI Japan Standards Committee.
Peter J. Fiekowsky, Quotation (Preliminary), Oct. 17, 1994.
Tran et al., "Application of Image Processing Software to Characterize the Photomask Key Parameters for Future Technologies," Processing of the SPIE—The International Society for Optical Engineering, vol. 3096, p. 423–432, 1997.

(List continued on next page.)

Primary Examiner—John Barlow
Assistant Examiner—John Le
(74) Attorney, Agent, or Firm—Beyer Weaver & Thomas, LLP

(57) ABSTRACT

A measurement tool connects to an automatic inspection machine for measuring microscopic characteristics of features on a photographic mask. Widths of densely packed lines are measured for features having sizes of less than about the wavelength of the examining radiation. A simulated intensity profile is subtracted from the actual measured intensity profile to obtain an error profile. The error profile provides edge position corrections which adjust the originally estimated edge positions. A new, simulated intensity profile is created and the process is repeated until the error profile is deemed acceptable. The line width is measured by measuring between the estimated edge positions. The opacity of a feature is determined and used for correcting dimension measurements. A formula determines the opacity based upon the contrast, the measured dimension and the single data point. Width or height of an irregular feature is calculated accurately. Dimension of the feature is determined using the peak width data and the peak width standard deviation.

14 Claims, 15 Drawing Sheets

OTHER PUBLICATIONS

Fiekowsky et al., "Defect Printability Measurement on the KLA–351: Correlation to Defect Sizing Using the AVI Metrology System", SPIE 19$^{th}$ Annual BACUS Symposium on Photomask Technology and Management Conference 3873, Sep. 1999.

Naoaki Aizaki; Photomask and X–Ray Mask Technology IV, vol. 3096; Apr. 17–18, 1997; Kawasaki, Japan; The International Society for Optical Engineering.

Peter Fiekowsky; Defect Printability Measurement on the KLA–351: Correlation to Defect Sizing Using the AVI Metrology System; Sep. 1999; SPIE 19$^{th}$ Annual BACUS Symposium Conference 3873.

Nicholas Doe; Richard Eandi; Optical Proximity Effects in Sub–Micron Photomask CD Metrology; Advanced Imaging Systems, Zygo Corp.

* cited by examiner

INTENSITY PROFILE FOR ISOLATED LINE

INTENSITY PROFILES FOR LINE AND ADJACENT EDGE

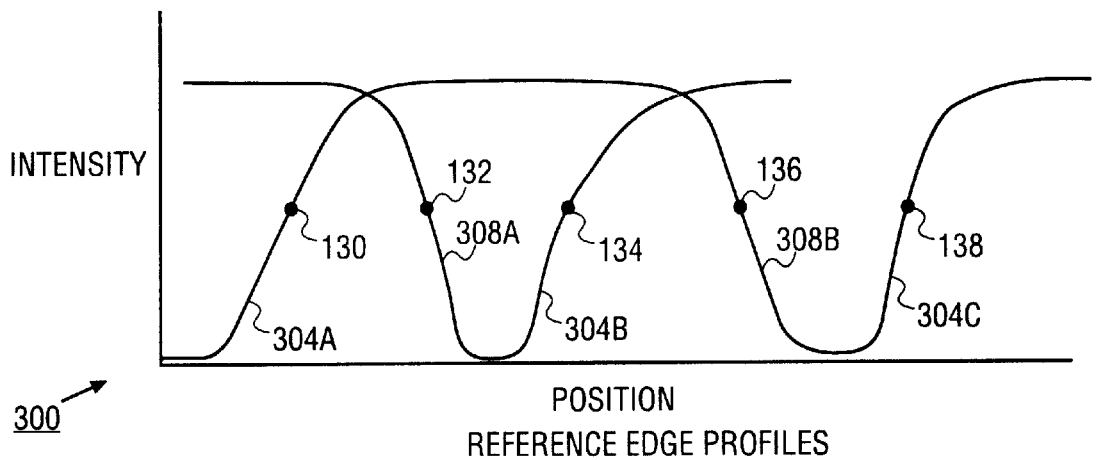
FIG. 7 REFERENCE EDGE PROFILES
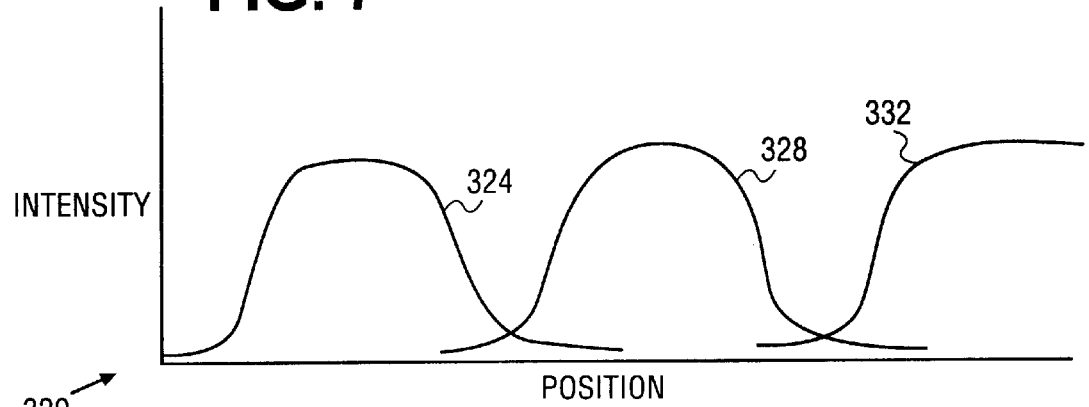
FIG. 8 INDIVIDUAL SIMULATED PROFILES
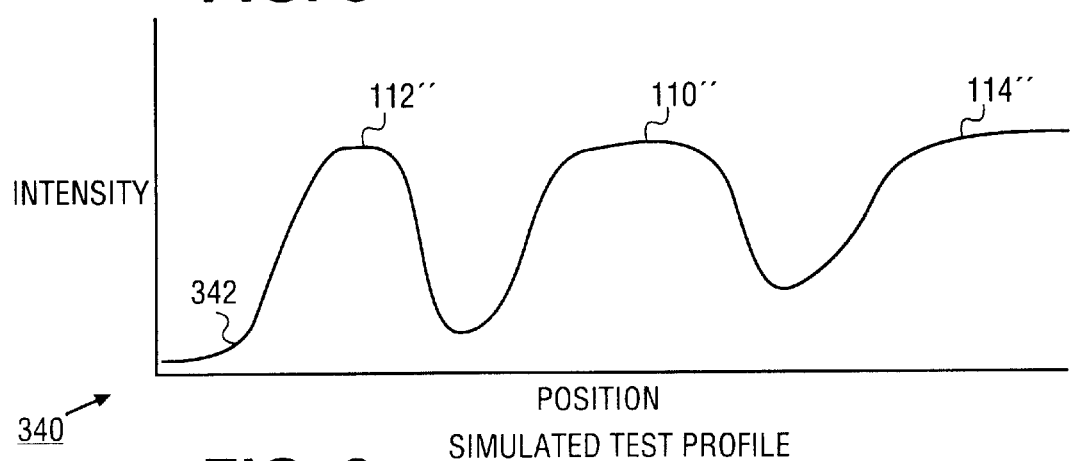
FIG. 9 SIMULATED TEST PROFILE

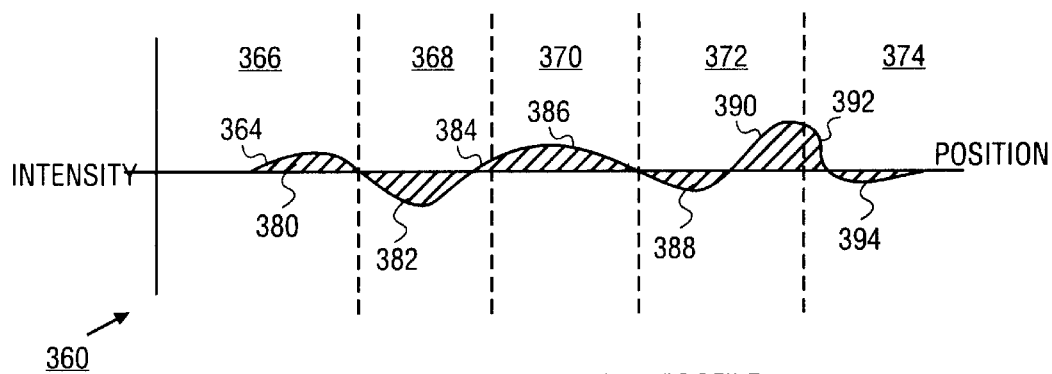
FIG. 10 ERROR INTENSITY PROFILE
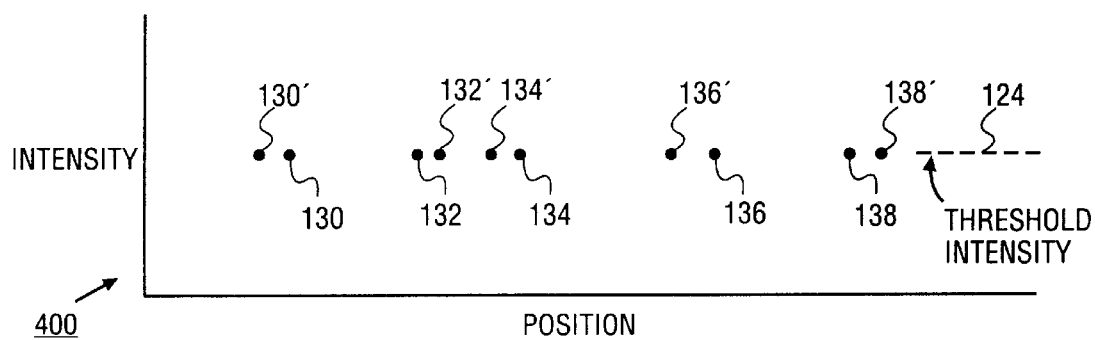
FIG. 11 ADJUSTMENT OF ESTIMATED EDGE POSITIONS
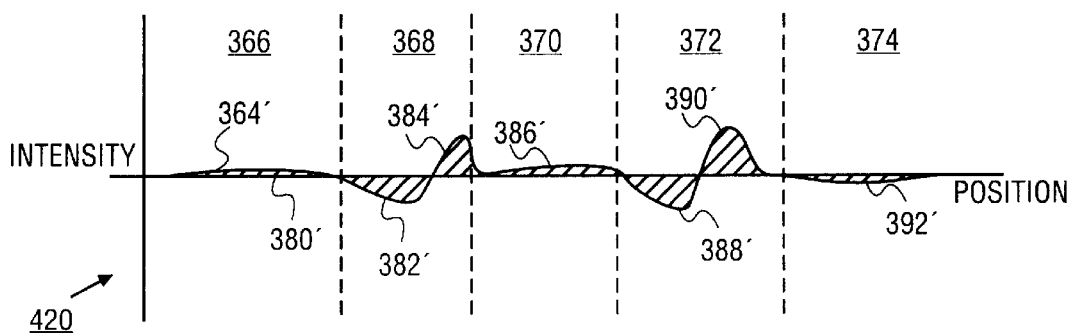
FIG. 12 ERROR INTENSITY PROFILE

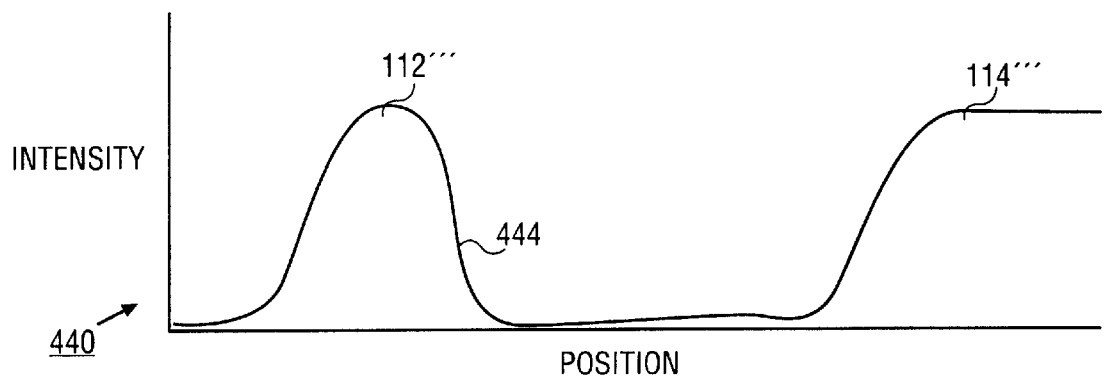
FIG. 13  SIMULATED INTERFERING EDGE PROFILE
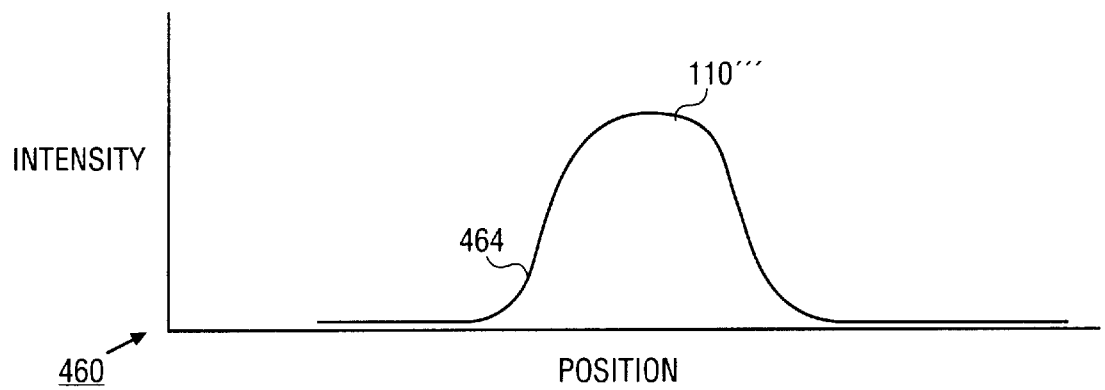
FIG. 14  LINE OF INTEREST PROFILE

MICROSCOPIC FEATURE DIMENSION MEASUREMENT SYSTEM

This application is related to U.S. Pat. No. 5,966,677 issued on Oct. 12, 1999 entitled "High Accuracy Particle Dimension Measurement System," to U.S. patent application Ser. No. 09/342,526 filed on Jun. 29, 1999 entitled "High Accuracy Particle Dimension Measurement System," to U.S. patent application Ser. No. 09/606,841 filed on Jun. 28, 2000 entitled "Microscopic Feature Opacity Measurement System," and to U.S. patent application Ser. No. 09/028,207 filed on Feb. 23, 1998 entitled "High Accuracy Particle Dimension Measurement System," which are all incorporated by reference.

FIELD OF THE INVENTION

The present invention relates generally to optical measurement systems. More specifically, the present invention relates to the measurement of features in semiconductor manufacturing.

BACKGROUND OF THE INVENTION

The successful manufacture of advanced sub-micron sized semiconductor devices requires the detection, measurement and evaluation of defects and imperfections as small as 1 micron on the photographic mask (photomask) used to pattern the wafer. Defect inspection and measurement techniques for masks therefore play an important role in mask making and quality assurance. Measurement of line widths is also important in producing an acceptable mask.

Thus, it is becoming increasingly important to be able to identify and to correctly size mask defects, line widths, and other features that are under 1 micron in size. Accurate sizing of these features allows masks that are below specification to be repaired, and prevents the needless and costly hold up of masks that do meet specification. However, one of the problems of assessing reticle quality at these sub-micron levels on an automatic inspection system is that the size of these features cannot always be accurately, quickly and cost-effectively measured in a production environment.

It has long been known that mask inspection tools are not measurement tools and that the size information provided by these tools has limited value. Consequently, many mask makers have incorporated measurement aids at the inspection station or move the mask to a more suitable measurement tool in order to make classification decisions. Measurement aids used at the inspection station include calipers, grids, and software based video image markers such as gates, scales, grids, boxes and circles. These aids are fairly rapid, but ultimately require the operator to "eyeball" the boundaries of the defect. This activity is very subjective and can lead to an error in the measurement of the defect.

For example, feature size is often measured by measuring the distance between opposite edges of the feature. Once a feature is identified by an inspection machine, the operator uses a video microscope and a television camera to position a cursor on one side of the feature and another cursor on the other side of the feature. The operator must judge for himself the exact boundaries of the feature and must place the cursors where he sees fit. At this point, the operator pushes a button and the software blindly computes the distance between the two cursors in order to supply a rough approximation of the dimension of the feature. This technique has many disadvantages.

Firstly, this measurement technique is operator dependent in that the operator must manually position the cursors on the boundaries of what the operator believes to be the feature. The operator may misjudge the type of a feature, its boundaries, or may simply misplace a cursor even if the feature is visible. The software then calculates the distance between the cursors, without regard for the type of feature, its true boundaries, etc. The above technique may be performed with a standard video microscope and has an accuracy of about 0.1 micron, but is completely subject to the operator's skill level and interpretation.

Another difficulty with light measurements of features less than 1 micron in size is that the wavelength of photons begins to interfere with the measurement of these 1 micron and less feature sizes. Many techniques do not adequately address the non-linearities associated with such measurements.

Alternatively, the mask may be removed from the automatic inspection tool and relocated on a more precise and repeatable measurement tool. However, this approach involves removing the mask from production, relocating the feature, and is thus impractical in a production environment. This technique is also costly, time-consuming and increases the handling risk. For example, an atomic force microscope (AFM) may be used to measure feature sizes; such a microscope is extremely accurate but is very slow, very expensive and is still subject to operator interpretation.

One approach that has been taken that uses calibration of an automatic inspection system in order to size defects is described in *Characterization Of Defect Sizing On An Automatic Inspection Station*, D. Stocker, B. Martin and J. Browne, Photomask Technology and Management (1993). One disadvantage with the approach taken in this paper is that it only provides a technique for measurement of defects of 1.5 microns and greater. Such sizes of defects would produce a linear relationship between reference sizes and actual measured sizes, and the paper does not account for defects less than 1 micron that would produce a non-linear relationship.

In general, measurement of line widths on a semiconductor mask can be broken into the two categories of isolated lines and dense lines. U.S. Pat. No. 5,966,677 describes a useful flux-area technique for measuring isolated defects or line widths, especially when they are smaller than the wavelength of light used to view them. This technique works best when at least 1.5 blur distances (the blur distance equals the wavelength in diffraction-limited optics) separates lines and/or features. Unfortunately, lines are not always separated by such distances.

The category of dense lines refers to adjacent lines (or other features) where the distance between the lines is less than about 1.5 times the wavelength being used to measure the lines. Prior art techniques for measuring line widths of dense lines are not always accurate or desirable.

In particular, line width measurement (also known as critical dimension or CD measurement) suffers increasingly from two basic limitations as feature sizes shrink. Firstly, features that are smaller then the wavelength of light become very hard to measure because their edge-to-edge measurement appears to approach the wavelength of the light used to examine them. Thus, measurement of line widths that are about the wavelength of light is difficult using prior art techniques. Secondly, measurement of a line width that has an adjoining feature (a line or other feature) that is less then about one and one-half times the wavelength of the examining radiation in distance becomes difficult. The defracted light from the neighboring feature confuses the measurement of the line width. Usually the confused measurement will be smaller then it should be because the neighboring feature will appear to increase the background light level.

FIGS. 1 and 2 illustrate problems with the conventional full-width half-maximum technique for measuring widths of dense lines.

A phenomenon is known as the optical proximity effect (OPE) influences critical dimension measurements of photographic mask and wafers in semiconductor manufacturing and has been a subject of intense interest and investigation for many years. OPE is caused by the convolution of the intensity profiles of adjacent lines and introduces errors in the determination of the line edge positions and in turn the line width. OPE is the result of any optical imaging system where adjacent line edges spread spatially such that the tail of the adjacent edge spread function if sufficiently close, influences the shape and thereby the determination of the position of the line edge in question. If the line edges for the line in question cannot be determined accurately, the line width cannot be measured accurately.

FIG. 1 shows a prior art approach which uses the full-width half-maximum technique to determine line width where the lines are isolated. Graph 10 is an intensity profile for an isolated line. Graph 10 includes an intensity axis 12 and a width axis 14 in microns. Intensity profile 16 is a profile for an isolated line such as is present on a photographic mask that is desired to be measured. Taking the 50% threshold values 18 and 20 for profile 16 easily leads to a calculation for the width of the line to be about 1 micron. For such an isolated line, measurement of its width based upon its intensity profile is relatively straightforward and accurate.

FIG. 2 is a graph 20 of intensity profiles for a line having an adjacent edge. Graph 20 includes an intensity axis 12 and a width axis 14 in microns. Shown superimposed in the graph are the resulting intensity profile 16' for the same line to be measured as in FIG. 1 and the intensity profile 22 of an adjacent edge in proximity. Due to the proximity of the adjacent edge (as indicated by the proximity of its profile 22), the profile 16' for the line has a different shape on its right hand side. Most notable, while the 50% threshold 18 is the same for the line, the 50% threshold for profile 16' occurs at location 24 rather than location 20 in FIG. 1. Thus, using the thresholds to measure the width of the line results in a measurement of about 0.9 microns rather than 1 micron which is the true width of the line. The resulting shift in the line width (as defined by the distance between edges at the 50% threshold level) results in a line that appears to be thinner. Note that this result could be caused by an adjacent edge or also by an adjacent line or any other adjacent feature that is close enough in proximity to the line to be measured to cause convolution of the intensity profiles. Thus, such an adjacent edge or other feature causes an inaccurate measurement of a line width. Further, the resultant profile 16' of FIG. 2 does not have a flat baseline that can be used as a reference. Thus, it is difficult to attempt to measure the flux under the curve to determine the area and thus the line width.

Prior art techniques for measuring line widths of dense lines are not always accurate or desirable. In a first conventional technique used for dense lines, a line width is measured by first measuring the distance between adjacent lines and then by applying a correction. This technique is referred to as multipoint calibration (MPC) and is not extremely desirable because it is hard to calibrate, and is highly dependent on the optical system used. A second conventional assumes that lines have uniform width and spacing. The average flux and pitch of the lines are measured, the fill ratio determined, and thereby the width of the clear and opaque regions are determined. This technique is not extremely desirable because lines of uniform width and spacing are seldom measured.

The paper entitled *Optical Proximity Effects in Submicron Photomask CD Metrology* by Doe et al. presents an extended multipoint calibration (EMPC) technique for line width measurement amongst densely packed lines. In particular, this paper discusses use of the threshold and maximum gradient algorithms for critical dimension calculations. These techniques are not always desirable because it is hard to calibrate, is highly dependent on the optical system used, and performs poorly when lines are very close. Thus, prior art techniques do not adequately address measurement of densely packed lines.

Turning now to a discussion of opacity, for isolated features it is desirable to be able to determine the opacity of the feature to be used in determining a corrected dimension (close to the actual dimension). For example, a dimension of a feature may be measured using the flux-area measurement technique described in U.S. Pat. No. 5,966,677 referenced above. The flux-area technique provides the effective width of the feature, which indicates that the feature absorbs the same amount of flux as a chrome feature having a width equivalent to the effective width. If the feature is less than opaque, though, its true width will be greater than the effective width. Thus, if a measurement of the actual width is desired, the effective width needs to be corrected. Other techniques for measuring a feature width may also result in values that should be corrected if a closer estimate of the actual width is desired.

By determining the opacity of a feature, its dimension can be corrected to determine a more accurate value. Although techniques for determining the opacity of a feature have been previously been described in U.S. patent application Ser. No. 09/028,207 referenced above, further techniques are desirable to improve upon those already described. It is desirable to have improved techniques in situations where quick set up and execution times are desirable.

Turning now to a discussion of irregular feature measurement, it is also desirable to be able to measure the height and width of a feature which may not be circular. That is, the feature may be irregular or have an oval shape. Although the diameter of a feature can be measured using the flux-area technique of U.S. Pat. No. 5,966,677, this technique assumes that the feature is roughly circular. Dimensions of features that are not necessarily circular are desirable. Isolated features whose dimensions are approximately larger than the wavelength of the radiation being used (about 0.5 microns for visible light) for measurement can be measured using conventional measurement techniques that are well-known in the prior art. For an isolated non-circular feature whose dimensions are approximately the size of the wavelength being used or smaller, its height and width may be measured as described in U.S. patent application Ser. No. 09/028,207 referenced above. Although useful, further techniques are desirable to improve upon those already described. It is desirable to have improved techniques in situations where quick set up and execution times are desirable.

Therefore, a feature measurement system is desirable that can provide reliable and repeatable measurements of densely packed lines and other features that are closer than about 1.5 times the wavelength being used for the measurement. It is also desirable for such a system to be able to measure opacity and height/width for features with greater speed. It would be especially desirable for such a system to operate in a fast and highly practical manner in a production environment.

SUMMARY OF THE INVENTION

A first embodiment of the present invention extends the flux-area technique by allowing line widths to be measured accurately even when the lines to be measured are closer than 1.5 times the wavelength being used. The lines may be as close as 1/10 the wavelength being used, or closer if camera and digitizer noise is sufficiently low. This embodiment can also be used for measuring any of a variety of other features that are densely packed, and can measure widths of lines which are extremely close to features other than lines.

In this first embodiment a simulated intensity profile is generated based upon estimated edge positions. The simulated profile is then subtracted from the actual measured intensity profile to obtain an error profile. The magnitude of the error for each edge determined from the error profile provides edge position corrections which are used to adjust the originally estimated edge positions. A new simulated intensity profile is then created from the newly estimated edge positions and the process is repeated until the error profile is deemed acceptable. Once deemed acceptable, the line width may be measured simply by subtracting the estimated edge positions of the line of interest.

Alternatively, line width may be measured by generating an isolated intensity profile for the line of interest. To generate this intensity profile, intensity profiles for the interfering edges are created using the final estimated edge positions. The simulated edge profiles are added together to produce a simulated interfering edge profile which is then subtracted from the original, measured intensity profile thereby leaving the isolated profile of the line of interest. The flux-area technique described in U.S. Pat. No. 5,966,677 referenced above may then be used to determined line width from the intensity profile.

A second embodiment is used to determine the opacity of a feature to use in correcting diameter or width measurements as well as helping to determine of what the feature is made. While prior art techniques may produce opacity values for relatively large particles, the present invention is especially useful for dimension measurements of less than perfectly opaque features that are less than about the wavelength of the examining radiation in size.

Advantageously, use of a single data point for contrast versus diameter to develop opacity data in the second embodiment allows for a rapid set up time for the system and quicker measurements. An operator can set up the system and perform calibration in approximately one minute (as compared to ten minutes in the prior art), and measurements can be made in approximately one second.

In this second embodiment, if one can assume a priori that the opacity is 100% then measurement of contrast can be used to determine the diameter of an isolated defect (or the width of an isolated line). It is realized that sizes that are smaller than about the wavelength of the examining radiation have a simple one-to-one relationship with the measured contrast of the feature. Thus, measuring the maximum contrast of such a feature can be used to calculate the defect diameter or line width.

In a third embodiment, peak width data is used to solve for the height or width of a feature without using the flux-area technique. Thus, more accurate dimensions for irregular features can be determined without having to assume that a feature is circular. It should be appreciated that the dimensions of height and width are arbitrarily imposed on the orientation of a two-dimensional feature, and the two terms can be interchanged without effecting the operation of the present invention. As used herein, width refers to a dimension parallel to a nearby line, while height refers to the dimension orthogonal to width.

Further, the second and third embodiments for determining opacity and the width/height of a feature may also be used with densely packed features. The technique of the first embodiment is first used to generate an isolated intensity profile for the feature of interest, then the second and/or third embodiments use the generated intensity profile for calculation of opacity or width/height.

Thus, embodiments of the present invention disclose a feature measurement system that provides an objective, practical and fast method for accurate measurement of characteristics of photographic masks. The present invention may be used while the mask is in place at the inspection station; there is no need for the mask to be removed to a different machine for measurement. A characteristic of the feature (such as diameter, width or opacity) is quickly measured by the present invention.

Benefits include avoiding repairing masks within specification and reaching equivalent results whether measured by customer or supplier (when calibrated with the same reference). Operator productivity and tool utilization is improved by rapid measurements taking place at the inspection station. Thus, by providing an extremely accurate measurement of mask features, the disclosed measurement tool helps to avoid unnecessary mask repairs and allows for improved process control. Also, operator variability is eliminated, and overall productivity and mask throughput is increased due to the accurate measurements in-place and documentation produced in seconds. Because the measurements are automatic, operator training is minimal.

BRIEF DESCRIPTION OF THE DRAWINGS

The invention, together with further advantages thereof, may best be understood by reference to the following description taken in conjunction with the accompanying drawings in which:

FIG. 7 is a graph showing reference edge profiles being used to create simulated profiles.

FIG. 8 is a graph showing individual simulated profiles produced by convolving the reference edge profiles of FIG. 7.

FIG. 9 is a graph of a simulated test profile.

FIG. 10 is a graph of an error intensity profile 364.

FIG. 11 is a graph showing adjustment of the estimated edge positions of FIG. 6.

FIG. 12 is a graph of an error intensity profile after a subsequent iteration of subtracting the simulated test profile from the test profile.

FIG. 13 is a graph for showing a simulated interfering edge profile.

FIG. 14 is a graph showing the intensity profile for the line of interest.

DETAILED DESCRIPTION OF THE INVENTION

Figure 1:
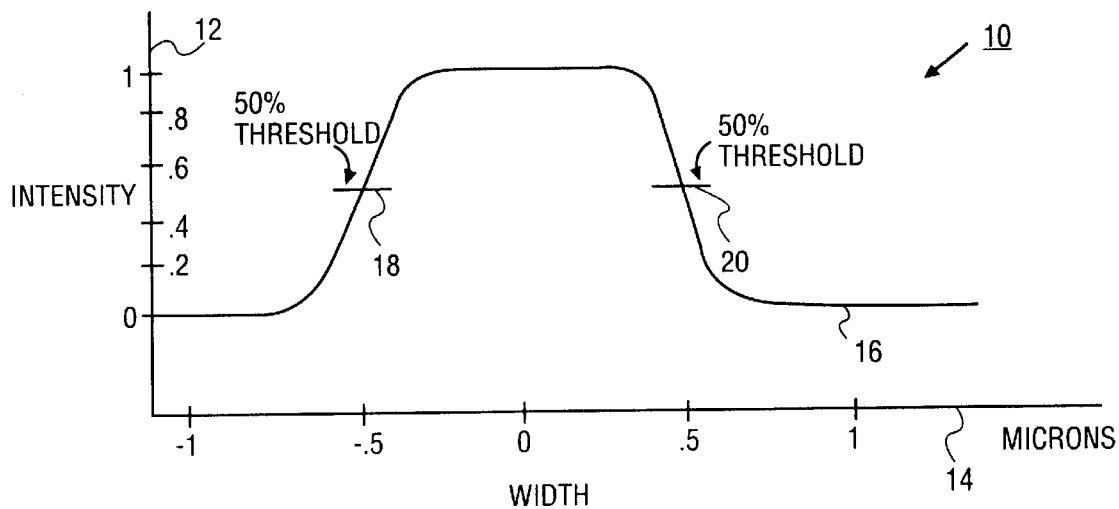
FIG. 1 shows a prior art approach where the full-width half-maximum technique is used to determine line width where lines are isolated.
Figure 2:
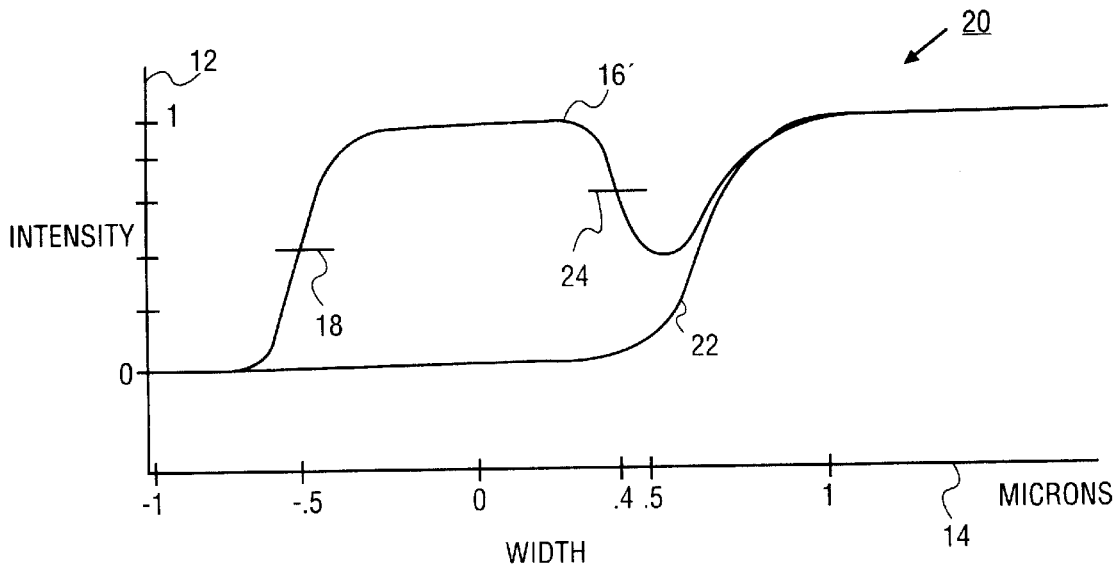
FIG. 2 is a graph of intensity profiles for a line of FIG. 1.
Figure 3:
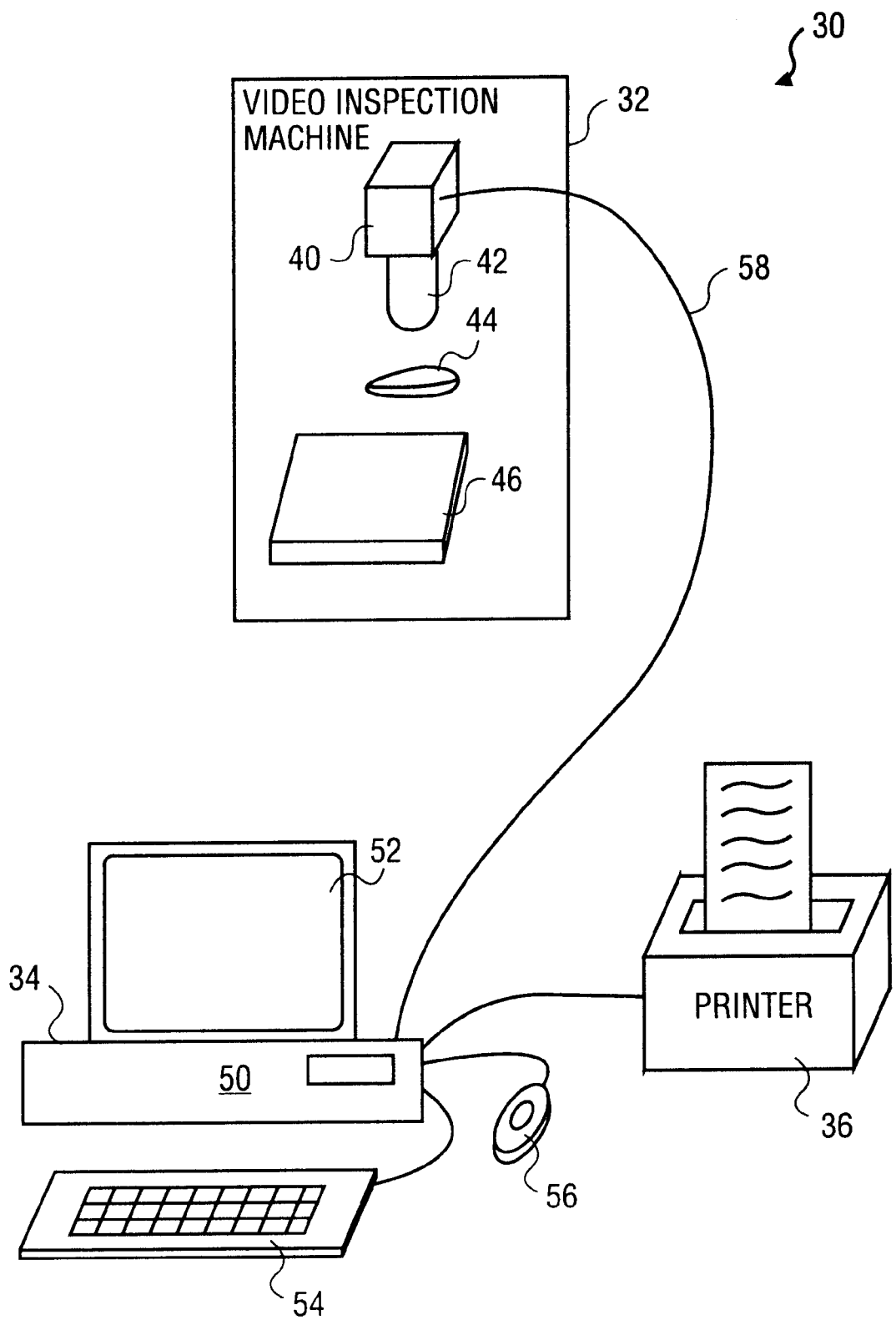
FIG. 3 illustrates a feature measurement system in accordance with one embodiment of the present invention.

FIG. 3 illustrates a feature measurement system 30 in accordance with one embodiment of the present invention. System 30 includes a video inspection machine 32, a computer system 34 and a printer 36. Video inspection machine 32 may be one of a wide variety of automatic inspection tools that analyze microscopic particles, lines, dimensions, etc., and outputs a video image of the microscopic features that it is analyzing. By way of example, machine 32 may be a KLA 2xx or 3xx automatic inspection tool used for inspecting photographic masks that are used in the manufacture of semiconductor devices. Other measurement systems such as KMS or LWMS systems, or repair systems such as DRS-1 or DRS-2, or simple microscopes can be used. Although this technique is mostly used with transmission microscope images, it can be used in reflection, thus measuring features on opaque substrates such as silicon wafers.

Machine 32 includes a video camera 40 having a lens tube 42 and a lens 44 that is inspecting a medium 46. Medium 46 may be one of a wide variety of media having microscopic features that are suitable for measurement by the present invention. By way of example, medium 46 is a glass reticule having a chrome pattern upon it forming a mask used in semiconductor manufacturing. Also, a wide variety of other media may be suitable for use with present invention. For example, media such as silicon wafers, printed circuit boards, other transparent media, and other types of masks may have measurements performed upon them using any of the various techniques of the present invention. In one embodiment, a multi-camera option may be used in which two or more inspection machines of different types provide video data to the measurement tool. Each machine may use separate calibration data which is changed automatically when input is switched to originate from that machine.

Computer system 34 may be any suitable computer system for embodying the measurement tool of the present invention. By way of example, computer system 34 may be a "personal" computer having hardware 50, a high resolution monitor 52, a keyboard 54 and a mouse or track ball 56. Printer 36 is also connected to computer system 34 for allowing results of feature measurements to be printed.

Computer system 34 is connected to machine 32 via cable 58 which may be any suitable cable for transmitting raw video output data from machine 32 to computer system 34. In operation, machine 32 transmits via cable 58 multiplexed (in time or by position) feature image data and reference data to computer 34 for analysis and measurement. The reference data received from machine 32 is an image of what a particular portion of the mask should look like free of defects. This reference data may be retrieved from a mask database or may be obtained by doing a die-to-die comparison. Reference data can be used when a good quality profile is difficult to obtain. Thus, machine 32 transmits not only the results of measuring artificially-produced standard features for the purpose of producing calibration data, but also transmits live video images of actual features of unknown dimensions and opacity that are identified upon mask 46.

Figure 4:
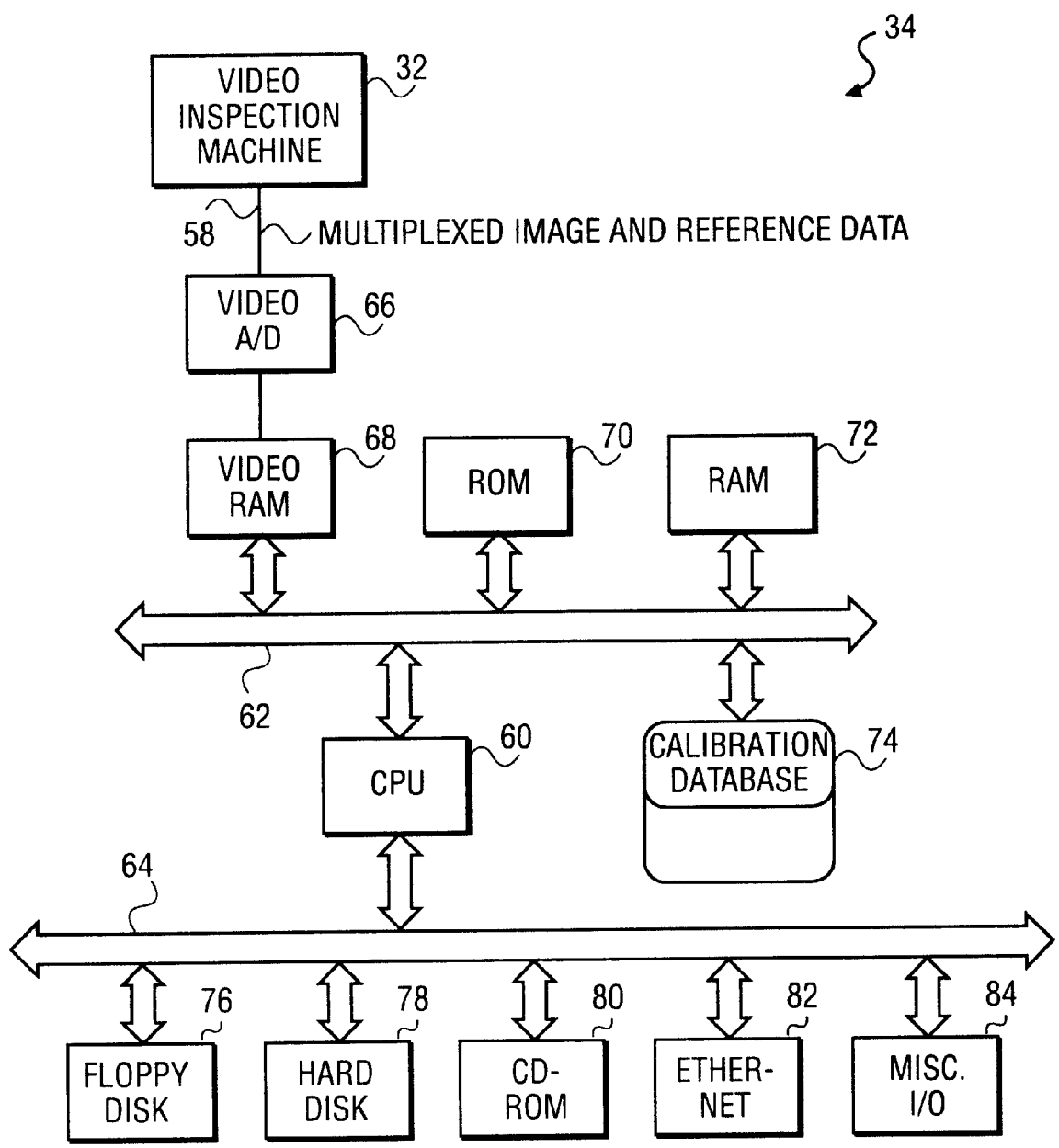
FIG. 4 illustrates in greater detail the computer system of FIG. 3.
Figure 22A:
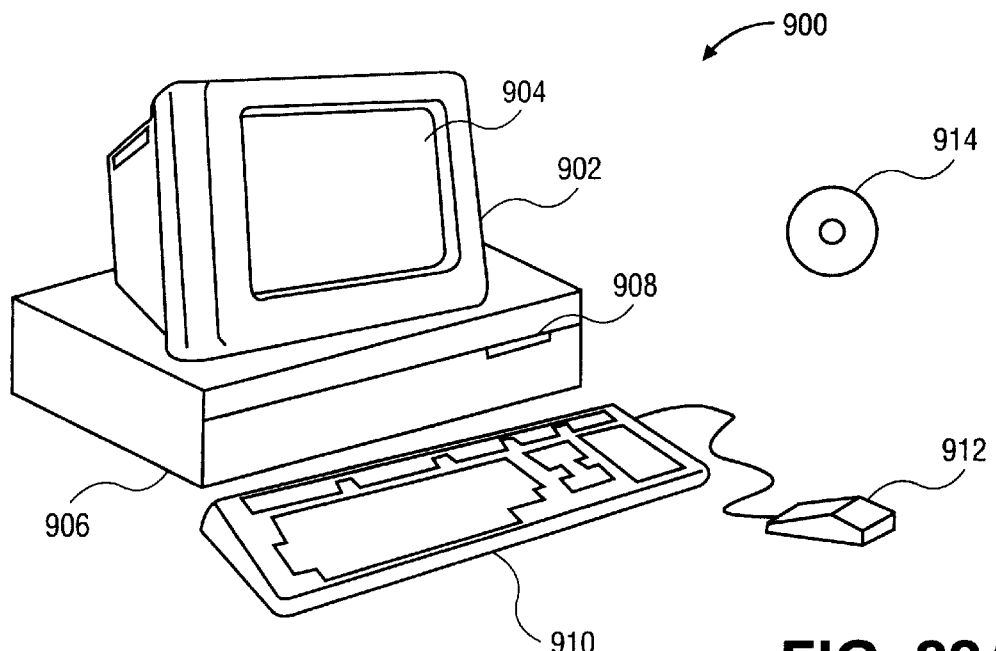
FIGS. 22A and 22B illustrate a computer system 900 suitable for implementing embodiments of the present invention.
Figure 22B:
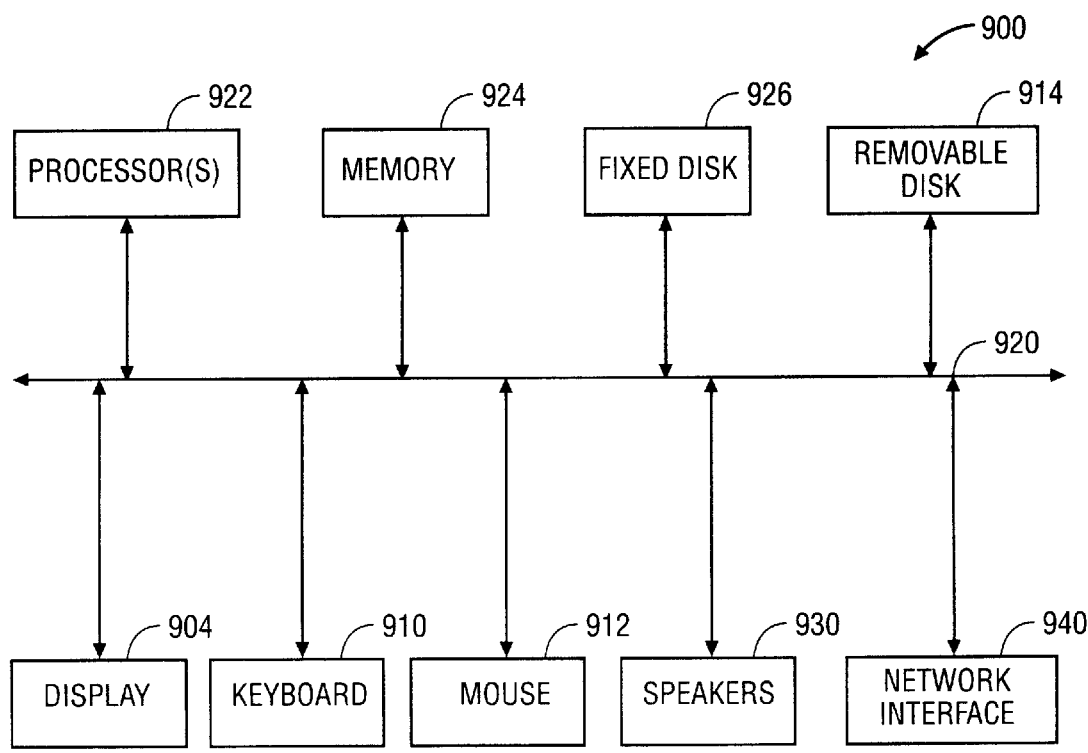

FIG. 4 illustrates in greater detail computer system 34 of FIG. 3. A wide variety of computer configurations may be used; one alternative embodiment for a computer system 34 is shown in FIGS. 22A and 22B. Hardware 50 includes a CPU 60 connected to a PCI bus 62 and also connected to any suitable computer bus 64. Video data from machine 32 travels over cable 58 to digitizer hardware 66 that converts the video analog signal to digital form. Hardware 66 is preferably high-resolution video capture hardware.

Once the video data has been converted to digital form by digitizer 66 the digital data is stored in video ram 68. Also connected to bus 62 is read-only memory (ROM) 70 and random access memory (RAM) 72. A calibration database 74 is also accessible via bus 62 and may be contained in any suitable memory of the computer. Calibration database 74 contains calibration data for machine 32. Connected to bus 64 are a wide variety of input and output devices. By way of example, shown are a floppy disk 76, a hard disk 78, a CD-ROM 80, a network connection 82 in the form of an Ethernet connection, and a wide variety of other miscellaneous input and output devices 84 that include printer 36, monitor 52, keyboard 54 and mouse 56.

FEATURES, DEFECTS AND LINE WIDTHS

The feature measurement system of the present invention is suitable for identifying and measuring a variety of features such as defects and line widths present on a photographic mask. A wide variety of defects may appear during the manufacture of the mask. Defects include isolated defects such as spots or holes, edge defects such as extensions and intrusions, and other types of defects such as edge roughness or incorrect line widths. Other features that may be measured include the width of a chrome line or the width of spacing between such lines, and the dimensions of contact holes which are used to create conductance between layers in a semiconductor.

A spot defect occurs when a particle of chrome or other contaminant is present by itself in location where it does not belong. A hole may occur when a section of a chrome line (for example) is lacking a piece of chrome such that a hole appears. An extension edge defect occurs when a portion of a line extends, or bulges out away from the line and is convex in shape. An intrusion edge defect occurs when a portion of a line is missing along an edge and has a concave shape. A line whose width is to be measured may be an opaque line, a semi-opaque line, a transmissive clear region between lines, or other.

A wide variety of other types of features such as dots, protrusions, corner defects, bridges, truncations, misplacements, half-tones, etc., as described in *SEMI Stan-* dards Programmed Defect Masks and Its Applications for Defect Inspection*, by H. Kawahira and Y. Suzuki, SEMI Japan Standards Committee, Mountain View, Calif., may be analyzed and measured using the invention disclosed herein.

ILLUMINATION AND INSPECTION EMBODIMENTS

The present invention is useful in conjunction with a wide variety of lighting sources and/or particle microscopes (such as an electron microscope). Considering lighting sources first, it is known in the art to use transmitted illumination, bright field illumination (also called axial illumination), and dark field illumination (also called oblique illumination) to illuminate a medium. Other similar lighting techniques may also be used and the present invention can be used with any of these lighting techniques. In fact, certain inspection machines are able to employ more than one lighting technique simultaneously, thereby aiding the operator in identifying and sizing particles and features. Because a particular particle or feature may appear best under a certain type of lighting, it can be advantageous to employ more than one lighting technique.

As mentioned above, one lighting technique applicable for use with the present invention is transmitted illumination. Using this technique, light is transmitted through a medium under inspection in order to identify and size various types of features. The transmitted illumination technique is most useful for transparent media because the transparent media will not completely block all of the transmitted light. Media that are suitable for use with transmitted illumination include glass reticles, semiconductor masks, etc., and other transparent media and semi-transparent media. By using transmitted illumination, different features may appear dark or bright. Whereas a spot defect, a chrome line or other opaque substance would appear dark, a hole or absence of a portion of a chrome line on a glass reticle would appear bright because the transmitted light is allowed to pass through the transparent medium.

Another lighting technique is bright field illumination. Unlike transmitted illumination, bright field illumination uses a lighting source that is directed onto, and thus reflected from, the medium under analysis. In a typical setup, a light source is located perpendicular to the lens axis and the light is directed onto the medium axially by way of a reflecting mirror. A camera or other sensing device then picks up the light reflected from the medium. Bright field illumination is advantageous for an opaque surface such as a silicon wafer or other material. For completely or nearly opaque media, transmitted illumination would not be particularly useful because the light would not be transmitted; thus, bright field illumination that uses reflected light can be more advantageous. In addition, bright field illumination may be used with transparent media such as glass, a semiconductor mask or other because such a material, even though able to transmit light, will also reflect light. In general, any reflective medium is suitable for analysis using bright field illumination. In particular, bright field illumination is useful for identifying and sizing excess chrome, dirt or other particulate matter on silicon wafers, chrome surfaces, etc.

With bright field illumination flat surfaces appear bright because they reflect light, while a surface, particle or feature more or less not flat will appear dark because it does not allow light to be reflected back to a sensing device. For example, with bright field illumination spot defects, holes, chrome lines, line extensions, etc. will appear dark, while a flat surface or a missing portion of a chrome line would appear bright. In general, any feature of about less than one micron in size will appear dark because such a feature is close to the wavelength of light; the feature would not necessarily appear flat, and thus would appear dark.

Another lighting technique suitable for use with the present invention is dark field illumination. In dark field illumination a lighting source is typically located at an oblique angle from the medium under analysis. In a typical setup, a circular fluorescent light encircles the lens and medium under analysis and provides lighting from the side. As the lighting is from the side, the flat medium will appear dark because it does not necessarily reflect light directly into the lens. However, spot defects, holes, chrome lines, line extensions, etc. will often appear brighter than the dark background because their curved or rough shape allows a certain amount of light to be reflected back up into the lens. For example, a hole or other indent in a flat medium such as a silicon wafer may appear bright, whereas the flat wafer itself would appear dark.

The various embodiments of the inventions described herein are also suitable for use with a variety of particle microscopes such as an electron microscope or a focused ion beam (FIB) microscope. That is, the techniques of the present invention are applicable to measurements made with particles other than electrons. Although many references to light measurements are made herein, and many of the measurements and units are applicable to visible light, the invention is not so limited. References are made to visible light measurements for ease of presenting the invention. Therefore, references to "wavelength" refer to light wavelengths, electron wavelengths, or wavelengths of other particles used for measurement.

For illustrative purposes, the present invention is described herein in connection with transmitted illumination, although the applicability of the invention is not so limited.

DENSE FEATURE AND LINE WIDTH MEASUREMENT

Figure 15A:
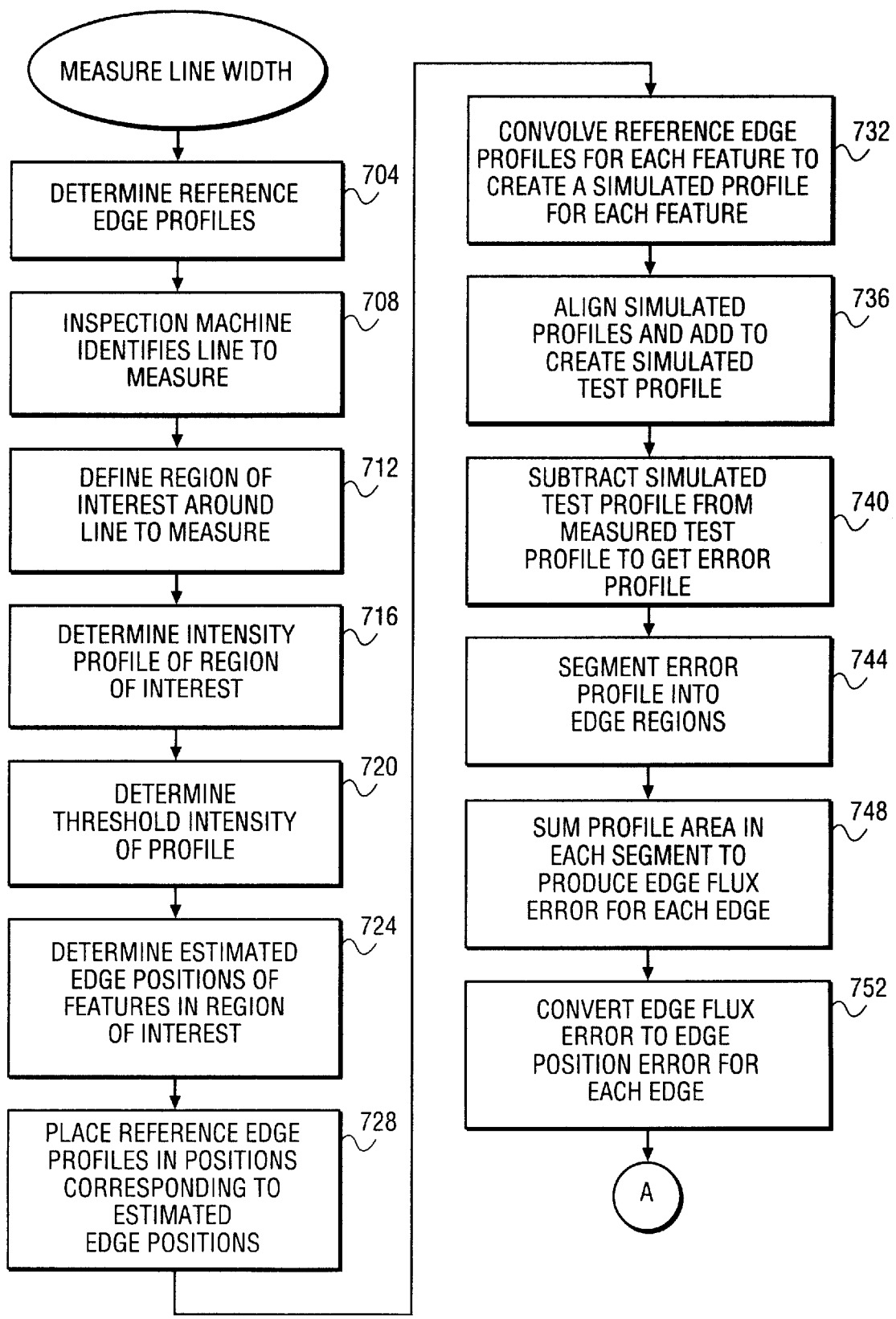
FIGS. 15A and 15B are a flow diagram describing a technique for measuring line width (or feature diameter) for densely packed features according to one embodiment of the invention.
Figure 15B:
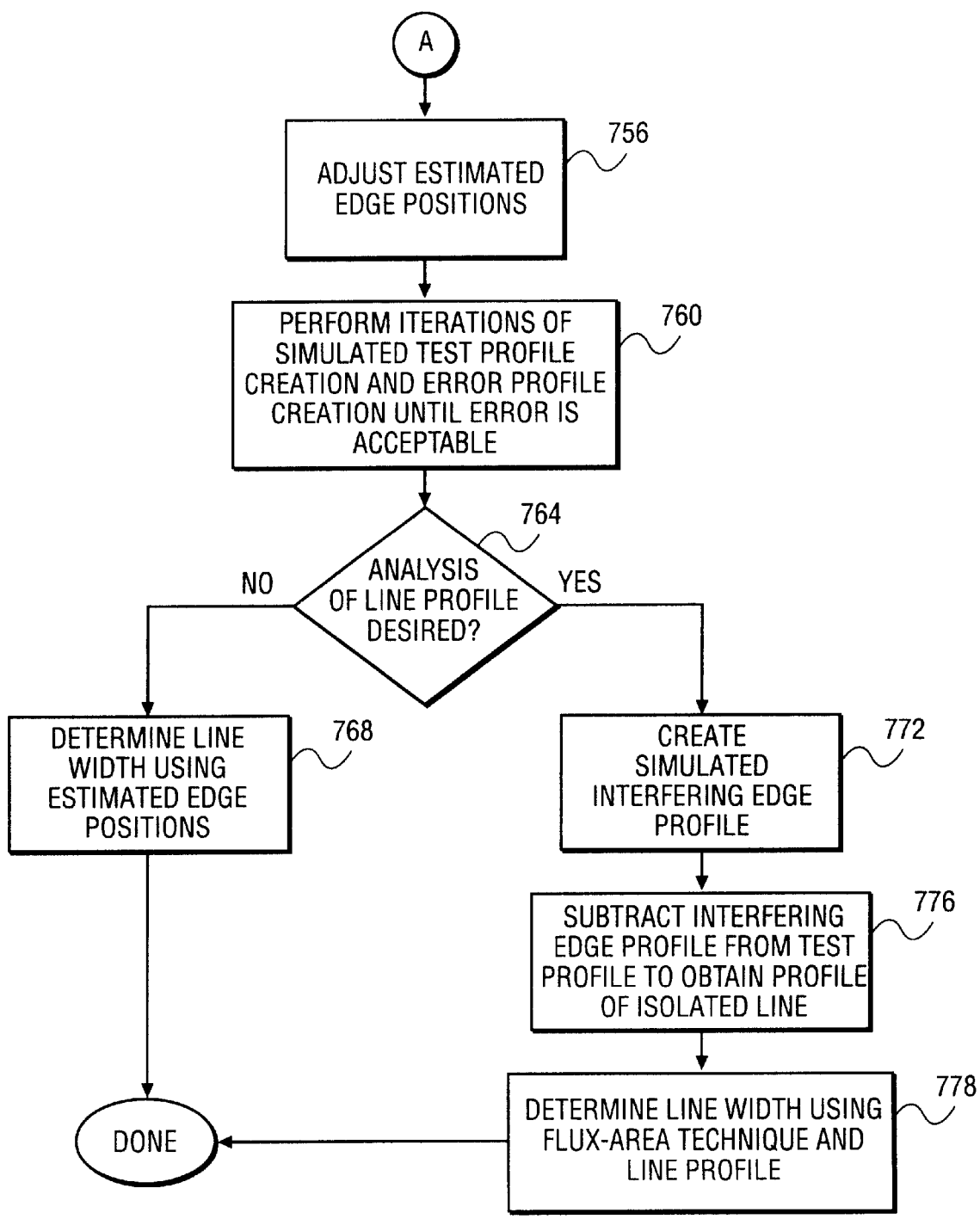

FIGS. 5–14 are presented briefly and then are discussed in further detail in the flow diagram of FIGS. 15A and 15B.

Figure 5:
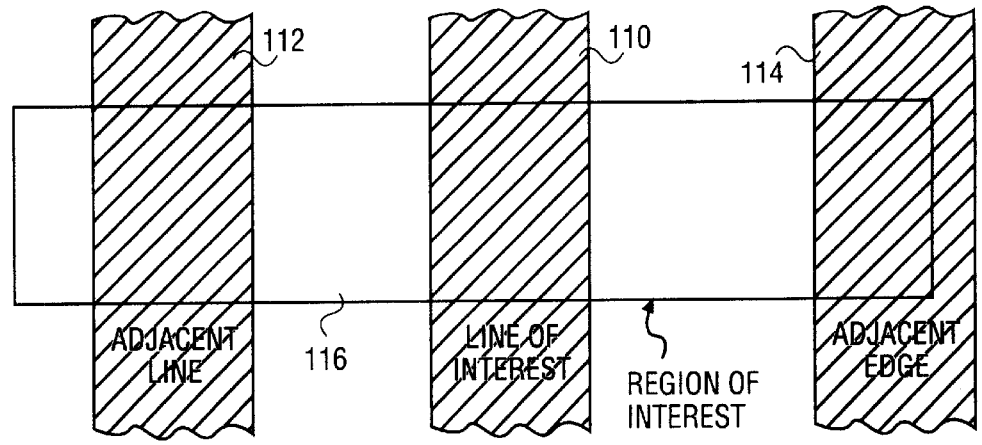
FIG. 5 is a digitized image of a region to be analyzed.

FIG. 5 is a digitized image 100 of a region to be analyzed. In this example, a photographic mask used in semiconductor manufacturing is being analyzed, although other media may also be analyzed. Included upon the mask is a line of interest 110 (whose width is to be measured), adjacent line 112 and an adjacent edge 114. As previously discussed, a feature other than a line may have its width or height measured, and the adjacent features need not necessarily be lines or edges, but can be any other feature present such as a spot, a hole, or a defect. The following discussion illustrates use of the invention in the context of measuring the line width of a line on a mask, although the invention is applicable to other situations. A region of interest 116 encompasses the line to be measured 110 and the adjacent features 112 and 114. Features 112 and 114 are extremely close to line 110 (less than about 1.5 times the wavelength of the examining radiation) and thus the present invention is applicable.

Figure 6:
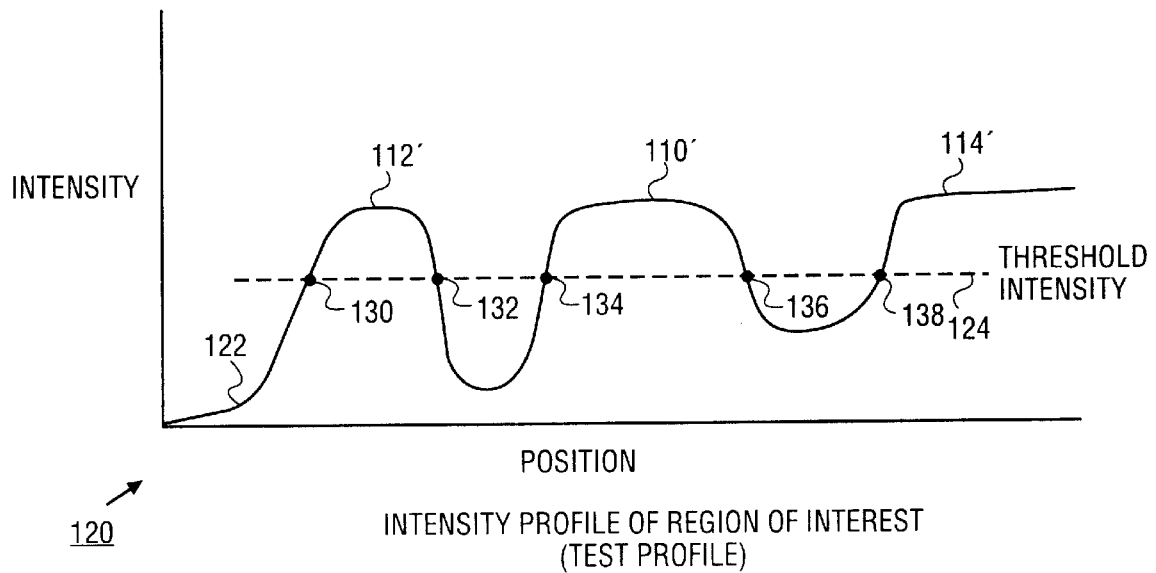
FIG. 6 is a graph of an intensity profile for the region of interest of FIG. 5.

FIG. 6 is a graph 120 of an intensity profile for the region of interest of FIG. 5. Graph 120 has an intensity axis and a position axis and includes resultant intensity profile 122. Humps 112', 110' and 114' are intensities that correspond to line 112, line 110 and edge 114 of FIG. 5. At a given threshold intensity 124 (typically 50%) edge positions 130–138 can be estimated for line 112, line 110 and edge 114. As previously discussed in the Background, estimated edge positions 130–138 do not provide an accurate location for the true edge positions because of the close proximity of line 112 and edge 114 to line of interest 110.

FIG. 7 is a graph 300 showing reference edge profiles being used to create simulated profiles. Dark-to-light reference edge profiles 304a, 304b and 304c and light-to-dark reference edge profiles 308a and 308b are shown. Placement of these reference edge profiles on graph 300 illustrates how they are used to create a simulated profile for each of features 112, 110, and 114 of FIG. 5. For example, the distance between the midpoints of reference edge profiles 304a and 308a on the left side of the graph corresponds to the distance between estimated edge position 130 and 132 determined in FIG. 6 for line 112. Similarly, the distance between the midpoints of reference edges 304b and 308b in the middle of the graph corresponds to the distance between estimated edge positions 134 and 136 from FIG. 6. Reference edge profile 304c on the right side of the graph is used to simulate the position of edge 114.

FIG. 8 is a graph 320 showing individual simulated profiles produced by convolving the reference edge profiles of FIG. 7. Profile 324 is a simulated profile for line 112 based upon estimated edge positions 130 and 132; profile 328 is a simulated profile for line 110 based upon estimated edge positions 134 and 136; and profile 332 is a simulated profile for edge 114 based upon edge position 138.

FIG. 9 is a graph 340 of a simulated test profile. Test profile 342 has humps 112", 110" and 114" that correspond to humps 112', 110' and 114' of FIG. 6. As profile 342 is simulated, it may not correspond exactly to test profile 122 of FIG. 6.

FIG. 10 is a graph 360 of an error intensity profile 364. Error profile 364 is produced as a result of subtracting simulated test profile 342 from test profile 122.

FIG. 11 is a graph 400 showing adjustment of the estimated edge positions of FIG. 6. Edge positions 130–138 are adjusted to new positions 130'–138' based upon error profile 364 of FIG. 10.

FIG. 12 is a graph 420 of an error intensity profile 364' after a subsequent iteration of subtracting the simulated test profile from the test profile. Error profile 364' may represent the results of a single subtraction, or may represent the results after any number of iterations have been performed.

FIG. 13 is a graph for 440 showing a simulated interfering edge profile 444. Interfering edge profile 444 includes simulated profiles for the interfering features line 112 and adjacent edge 114 of FIG. 5. Humps 112'" and 114'" correspond to line 112 and edge 114, respectively.

FIG. 14 is a graph 460 showing the intensity profile for the line of interest 110. Intensity profile 464 has been determined to be an accurate intensity profile for line of interest 110.

FIGS. 15A and 15B are a flow diagram describing a technique for measuring line width (or defect diameter) for densely packed features according to one embodiment of the invention, and will be discussed with reference to FIGS. 5–14.

Once a feature is identified, a dimension of the feature is measured in-place using computer 34 which receives live video information from inspection machine 32. Thus, analysis and measurement of the feature occurs while the mask is in place in the inspection machine and there is no need to remove the mask to another machine for measurement of a feature. This technique allows for extremely rapid measurements to be made. This inspection of a mask may occur in a mask shop before the mask is shipped out to a customer, or may also occur in a wafer fabrication shop when a mask is received.

Although FIGS. 6–14 illustrate graphically how profiles and edge positions are placed on graphs and manipulated, those of skill in the art will appreciate that computer software is preferably used to manipulate the profiles and positions and to perform calculations using them as described in the below steps.

In step 704 system 30 is used to determine reference edge profiles as part of an initial calibration step. A reference edge profile is used below to simulate an actual edge corresponding to an estimated edge position. A reference edge profile can be determined by digitizing an image of an edge present on a mask and then determining its intensity profile, or can be determined theoretically by convolving an edge with the Gaussian optical transfer function, yielding the "error function." These techniques are known to those of skill in the art.

Step 704 is preferably performed by first finding an edge on a mask using system 10, placing a region of interest around the edge and then determining the edge profile. The size of the region of interest is preferably four times the wavelength both above and below the line. The region may extend any distance along the line as long as the line is uniform. In most cases, rising and falling edges should be measured (to provide both a light-to-dark and a dark-to-light transition) although an ideal optical system could yield perfectly inverted curves for the two and only one edge need be measured. Alternatively, multiple profiles of an edge can be averaged to yield higher intensity resolution.

In step 708 video inspection machine 32 is used to identify a particular line on a mask whose width is to be measured. In a preferred embodiment, system 30, as part of the mask production process, automatically identifies lines to be measured. In another embodiment, a line to be measured may be identified manually by the operator. Once a feature is detected, the inspection machine enters review mode and the video image of the feature site may be displayed on the monitor of the computer.

In step 712 a region of interest is defined around the line to be measured. Such a line of interest 110 is shown in FIG. 5 along with adjacent lines and edges and region of interest 116. In a preferred embodiment, this region of interest is defined automatically by system 30. The height of the region of interest is predefined by an engineer and depends upon how much of the line the engineer desires to average in the determination of its width. The width of the region of interest is determined by identifying the edges of the line to be measured and extending the region of interest approximately four wavelengths out from each edge. This distance from the edges need not be precise. Preferably, a distance of four wavelengths is used because a distance of two wavelengths is used to estimate a nearby edge, and that edge may be two wavelengths away from the line to be measured and still affect the measured size. Alternatively, an operator may draw a region of interest around the line to be measured. A wide variety of techniques may be used by the operator to indicate the region of interest around the feature. By way of example, the operator may use a mouse, track ball or other input device to drag a region around the feature.

In step 716 the intensity profile is determined for the region of interest of FIG. 5. Such an intensity profile 122 is shown in FIG. 6. This measured intensity profile based upon the region of interest is referred to as the "test profile." An intensity profile is preferably developed as described in U.S. Pat. No. 5,966,677 referenced above.

Next, in step 720 a threshold intensity 124 is determined for profile 122. Preferably, this threshold intensity value is determined by averaging the minimum and the maximum value from profile 122. In step 724 estimated edge positions for the features in region of interest 116 are determined using threshold intensity level 124. Given profile 122 of graph 120 and a threshold intensity value 124, the system can calculate estimated edge positions 130–138 for the features of FIG. 5. In this example, estimated edge positions 130 and 132 correspond to the edges of line 112, positions 134 and 136 are estimates for the edges of line 110 and position 138 is an estimate of the edge of edge 114. These estimated edge positions are stored for future use.

In step 728 a reference edge profile created in step 704 (either a light-to-dark or a dark-to-light) is placed into position for each of the estimated edge positions determined in step 724. This step is illustrated in FIG. 7. As shown in FIG. 7, a dark-to-light reference edge 304*a* is placed so that its midpoint corresponds to the left estimated edge position 130 of line 112. Similarly, a light-to-dark reference edge profile 308*a* is placed such that its midpoint coincides with the right estimated edge position 132 of line 112. In this fashion, the two reference edge profiles are used to simulate the estimated position of the left and right edges respectively of line 112. Because reference edge profiles 304*a* and 308*a* have been determined previously in step 704 and are believed to be very accurate, they are used to simulate the edges of line 112 based upon its estimated edge positions 130 and 136 determined in FIG. 6. Reference edge profiles 304*b* and 308*b* are also used to simulate the edge positions 134 and 136 of line 110, and reference edge profile 304*c* is used to simulate the edge of region 114 at its estimated position 138.

The following steps are used to create a simulated test profile that is as close to the measured test profile as possible based upon estimated edge positions 130–138. Through the use of reference profiles that are placed at estimated edge positions 130–138, simulated profiles for each feature are created via convolution. Once a simulated profile has been created for each feature (in this case line 112, line 110 and edge 114), these simulated profiles are aligned and added together to produce a simulated test profile. By then subtracting the simulated test profile from the actual measured test profile, any errors can be determined and the magnitude of these errors can be used to readjust estimated edge positions 130–138 to approach the true edge positions. This process of creating individual simulated profiles and subsequently a simulated test profile to be subtracted from the measured test profile is performed in an iterative manner until the errors calculated after subtraction are relatively small. Once the errors are negligible, the estimated edge positions can be used as the true edge positions for the features under examination.

In step 732 the reference edge profiles corresponding to a single feature in the region of interest are convolved together to created a simulated profile for each feature. For example, reference edge profiles 304*a* and 308*a* are convolved together to produce simulated profile 324 that simulates the profile of line 112. In a similar fashion, the profiles 304*b* and 308*b* are convolved together to produce simulated profile 328 for line of interest 110. Also, profile 304*c* is essentially convolved with a line having a value of one to produce simulate profile 332 which simulates the profile of edge 114. This convolution of reference edge profiles for each feature may take place consecutively for each feature or convolution may occur together. The result as seen in FIG. 8 is a simulated intensity profile for each of the features within the region of interest. At this point, the simulated profiles of FIG. 8 do not yet resemble profile 122 from FIG. 6 because the simulated profiles of FIG. 8 have been produced individually by calculations, whereas profile 122 is an intensity profile of all the features in the region of interest measured together.

In step 736 the individual simulated profiles of FIG. 8 are aligned so that they correspond with their respective positions from FIG. 6. For example, the midpoints of the edges of simulated profile 324 are aligned to coincide with estimated edge positions 130 and 132 of FIG. 6. Similarity, the midpoints of the edges for profile 328 are aligned to coincide with estimated edge positions 134 and 136 of FIG. 6. Next, the aligned simulated profiles (324, 328 and 332) are added together to produce the simulated test profile 342 of FIG. 9. As shown, the resulting simulated profile 342 has humps 112", 110" and 114" and corresponds roughly to the measured test profile 122 of FIG. 6.

Next, in step 740 the simulated test profile 342 is subtracted from the actual test profile 122 to produce an error profile. Subtraction of simulated profile 342 from test profile 122 results in error intensity profile 364 of FIG. 10. Error profile 364 indicates errors in the initial estimated edge positions 130–138 of FIG. 6. In this example, an edge position that was estimated too far to the left produces a line wider than actual and less light is received. Similarly, an edge position estimated too far to the right will result in too much light being received.

To facilitate analysis of the error profile, the profile is segmented into edge regions in step 744. Analysis of each edge of a feature is important in determining its edge position rather than an analysis of a complete profile of a feature. Accordingly, error profile 364 is the segmented into edge regions 366–374 as shown. Segment 366 corresponds to the left edge of line 112 and its original estimated edge position 130. Segment 368 corresponds to the right edge of line 112 and its original estimated edge position 132. In a similar fashion, segments 370, 372, and 374 correspond to original estimated edge positions 134, 136 and 138.

Segment 366 has a region 380 having a positive intensity value, indicating that too much light has been received and the original estimated edge position was to far to the right. Segment 368 has a large negative intensity region 382 and a small positive intensity region 384. Segment 370 has a large positive intensity region 386. Segment 372 has a small negative intensity region 388 and a larger positive region 390. Segment 374 has a small positive region 392 and a larger negative region 394.

In step 748 the total profile area in each segment is summed to produce an edge flux error for each edge. Flux corresponds to the number of light photons passing through a medium (or reflected from a medium) and is expressed in units of scaled photons. An opaque feature such as a spot or a line blocks the passage of photons and reduces flux (for transmitted light), while a clear portion of a mask such as formed by the space between lines, or the gap created by an intrusion into a line, passes photons easily and results in an increase in flux. For reflective light, the opposite would hold true.

In this example, the edge flux error for the left edge of line 112 is the total positive area of region 380 in units of flux. The edge flux error for the right edge of line 112 is the sum of the area in segment 368 which will be a negative flux-area as region 382 is larger then region 384. The edge flux error in segment 370 corresponding to the left edge of line 110 is a positive flux value corresponding to the area in region 386.

The edge flux error for the right edge of line 110 is found by summing the area in region 390 and the negative area in region 388 to obtain a positive flux value. The edge flux error for the edge of adjacent edge 114 is a negative flux value found by summing region 394 with region 392 in segment 374. Thus, a flux error value is associated with each edge of the features of interest. In this example, a positive flux value indicates the original estimated edge position with too far to the right while a negative flux value indicates the original estimated edge position was too far to the left.

Accordingly, in step 752 each edge flux error is converted to an edge position error in order to adjust the original estimated edge positions. This conversion may be performed in different manners and into a variety of units. In one embodiment, the edge flux error in units of flux is divided by the intensity range of the error profile to yield an edge position error in units of pixels. Each estimated edge position may then be adjusted by a certain number of pixels. Determination of the intensity range for error profile 364 is a technique known to those of skill in the art and is also described in U.S. Pat. No. 5,966,677 referenced above.

Once an edge position error (which may be a positive or negative value) has been determined for each edge, each edge position error is added to the original estimated edge positions in step 756 in order to adjust the original estimated edge positions. FIG. 11 illustrates adjustment of the edge positions. For example, as segment 366 has a positive area, this indicates that original estimated edge position 130 was too far to the right. Accordingly, addition of the edge position error to the original position moves the new estimated edge position to position 130'. By contrast, the total profile area in segment 368 is a negative value indicating that estimated edge position 132 was originally too far to the left. Accordingly, adding the edge position error to this edge moves the new estimated edge position to location 132'. In a similar fashion, estimated edge position 134 is adjusted to location 134' slightly to the left. Also, edge position 136 is adjusted to the left to new position 136'. Finally, the edge of adjacent edge 114 is adjusted slightly to the right to new position 138'. These new estimated edge positions are then stored in a database for future use. Now that a better estimate of the actual edge positions has been calculated, a line width or feature width may be determined, or more iterations may be performed to obtain more accurate edge positions.

If more iterations are desired, subtraction of the simulated profile from the test profile and creation of a modified error intensity profile is performed over and over again until the determined edge position errors are deemed acceptable (step 760). In a preferred embodiment, only one or two iterations need be performed until the error is deemed acceptable. To perform a subsequent iteration once estimated edge positions have been adjusted in step 756, steps 728 through 756 are performed again to determine new edge positions errors and more accurate edge positions. If these errors are deemed acceptable after an iteration then iteration may cease. If the errors are still large, then another iteration may be performed. In one embodiment of the invention, an edge position error is deemed acceptable if its value is below about 1/20 of a pixel.

FIG. 12 shows an error intensity profile 364' after any number of iterations and illustrates acceptable errors in one embodiment. Note that region 380' has an extremely small positive profile error which would convert into a small edge position error that would be acceptable. Likewise, regions 386' and 392' have small profile areas that would also convert into edge position errors that may deemed acceptable. Segment 368 includes a positive area 384' and a negative area 382' that, when added together, would produce an approximately zero total profile area. The same situation occurs in segment 372. As the total profile areas within these segments are close to zero, the edge position error may also be deemed acceptable.

Once the edge position errors have been deemed acceptable and final adjustment has been made to estimated edge position 130–138, it is determined in step 764 if analysis of an intensity profile of the line of interest 110 would be desirable. If a profile is not desired, then in step 768 the line width for line 110 may be simply calculated using the final estimated edge positions 134 and 136. The final value in pixels may then be converted to microns by the microns per pixel scale factor described in U.S. Pat. No. 5,966,677 referenced above.

If a profile of line 110 is desired, then steps 772–778 are performed. A profile of line 110 may be useful not only for calculating its line width, but also for calculating the contrast and opacity of the line. Opacity is useful for correcting a measured dimension of a feature that is not perfectly opaque. A discussion of calculation of the opacity of a feature and/or a dimension of a feature based upon contrast is found below with reference to FIGS. 16–21.

In step 772 a simulated interfering edge profile 444 is created as shown in FIG. 13. Interfering edge profile 444 is a simulated profile that represents the profile of line 112 and adjacent edge 114 (the interfering edges). Creation of this profile may be performed as previously described in steps 728 and 732 and as illustrated in FIGS. 7 and 8. As shown and described, reference edge profiles are convolved to create individual simulated profiles 324 and 332 for line 112 and edge 114. These individual simulated profiles are independent of line of interest 110 and represent as closely as possible a true profile for each feature without any interference.

Next, the two simulated profiles 324 and 332 are aligned and summed as previously described in step 736 (except without profile 328 of line 110) to create the simulated interfering profile 444. Profile 444 now best represents a profile of region of interest 116 as if line of interest 110 were not present.

Next, in step 774 interfering edge profile 444 is subtracted from the actual measured test profile 122 to obtain the best representation of a true profile of line 110. FIG. 14 shows this profile 464 of line 110. Because the interfering edge profile has been subtracted from the actual measured profile it is believed that the resulting profile 464 best represents a true and accurate profile for line 110 as if it were not in close proximity to line 112 and edge 114. Thus, profile 464 may now be used to perform accurate calculations for various dimensions and characteristics of line 110.

For example, in step 778 line profile 464 is used to determine the line width of line 110 using the flux-area technique. The flux-area technique for determining a line width from the intensity profile of a line has previously been described in U.S. Pat. No. 5,966,677 referenced above, and the reader is directed to that disclosure for an understanding of the flux-area technique. Once an accurate profile for line 110 has been determined (absent any interfering features) the profile may be used for other calculations as well.

Once the dimension (such as diameter or line width) of the feature has been accurately determined, the dimension of the feature in microns is displayed on the computer monitor. The operator also has the option to store the feature and its measured dimensions along with a description into a feature database for later retrieval and analysis. The operator may also print images of the feature and its dimensions at this time. It should be noted that at any time in this process, previously stored features and dimensions may be reviewed, and these selected features and associated text can be selected and printed. Once the operator has finished with a particular feature, the live image display is returned to the computer monitor and the operator continues to detect and measure additional features.

OPACITY DETERMINATION AND DIMENSION CORRECTION

As described above, the ability to accurately measure the opacity of a feature having dimensions on the order of 0.5 micron and less (for visible light) is advantageous. More broadly, for other wavelengths of light and/or particle beams, the invention works well for features having dimensions that are about or less than the wavelength being used.

The determination of opacity for a feature assists in correcting for a measured area, width, height and/or other dimension of a feature that is not perfectly opaque. Although a determination of opacity is optional, calculation of an opacity value is helpful in correcting measured dimensions of features that are less than perfectly opaque. Furthermore, measurement of opacity helps in determining what a feature is made of in addition to assisting in correction of a dimension measurement. For example, "hard" features of an opacity of about 100% can be assumed to be of metal or similar material, while "soft" features of a lesser opacity are more likely of a less opaque substance such as dirt.

An opacity calculation may be used on isolated defects such as spots or holes, as well as on edge defects. Calculation of the opacity for an isolated defect is more straightforward because of the stark contrast between an isolated defect and its background. Calculation of opacity for an edge defect has been found to be best performed after reference subtraction. For example, a reference image for a chrome line is subtracted from the actual image of the line with the defect in order to produce the defect by itself against a stark background. This technique of alignment and reference subtraction for edge defects better allows the contrast and thus the opacity to be measured.

Figure 16:
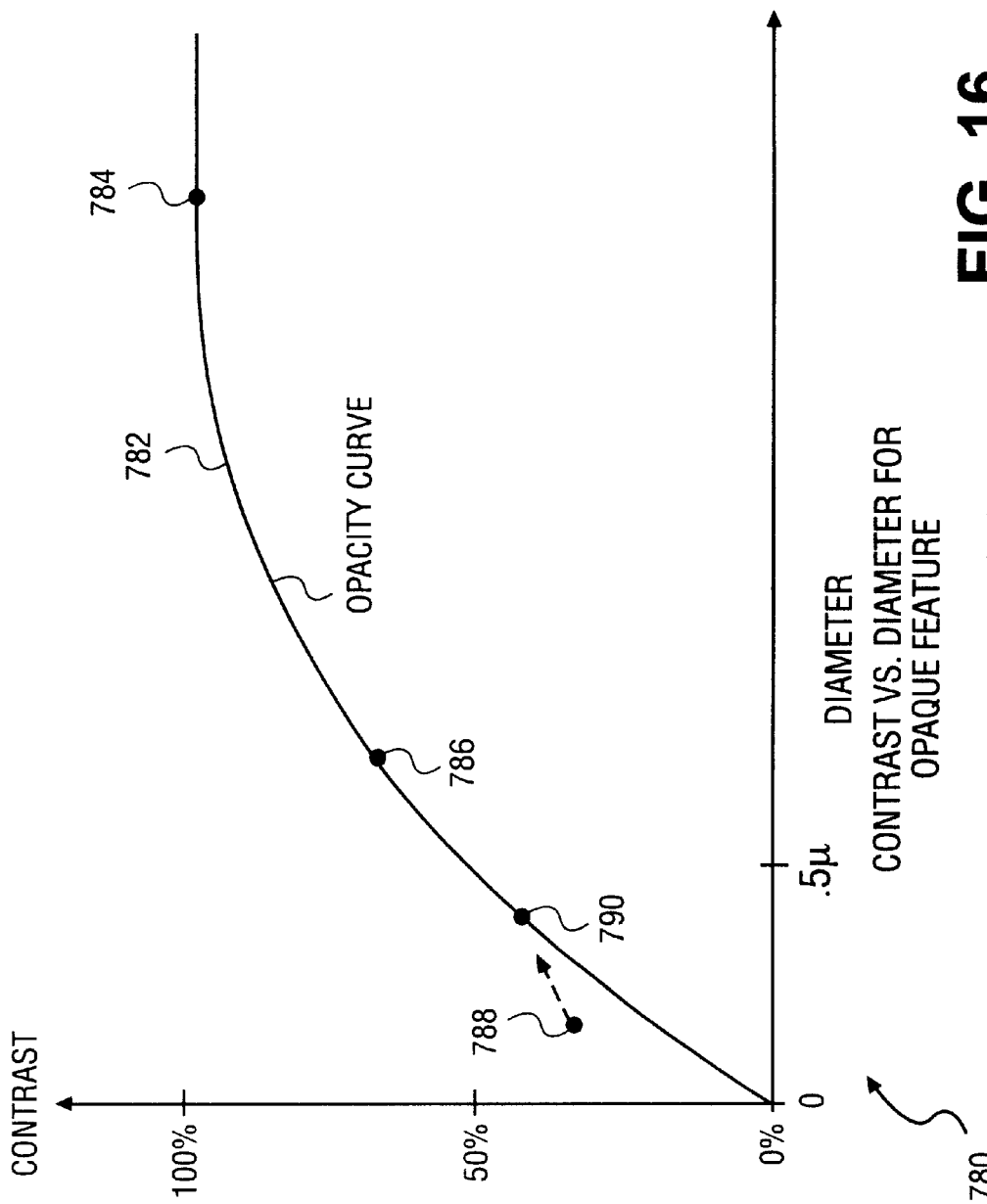
FIG. 16 is a graph illustrating contrast versus diameter for an opaque material.

FIG. 16 is a graph 780 illustrating contrast versus diameter for an opaque material. Graph 780 shows an opacity curve 782 representing the perceived contrast for an opaque material in relation to its diameter. Opacity curve 782 illustrates that an opaque material (such as a chrome spot defect) having a diameter substantially greater than the wavelength of light will fall on opacity curve at point 784 or farther out (100% contrast). I.e., at point 784 (and for opaque materials greater than this diameter) an opaque material has a contrast of 100% with its background. Of course, for a feature having a diameter of zero, the contrast will be 0% with its background. In between these two points, however, the contrast for an opaque material against its background will vary between 0% and 100%.

One reason is because the size of such a feature is close to that of the resolution of the optics being used. In other words, the blurring of a feature whose size is close to, or less than, the resolution results in a contrast for that feature that is less than 100% even though the feature may be perfectly opaque. For example, point 786 represents a spot or hole defect that has a diameter close to 0.5 microns and has a contrast with its background of about 60% or so.

Advantageously, this embodiment of the present invention recognizes that materials that are less than perfectly opaque will fall at a point off of the opacity curve when their contrast is compared to their measured diameter. For example, a spot defect that is partially transparent (such as dirt or other substance that is not perfectly opaque) will end up producing more light flux that is received by a camera. Because more light flux is received (as opposed to a perfectly opaque spot defect), the spot defect will appear smaller in diameter than it truly is. In addition, because the spot defect is not perfectly opaque, its contrast will be lower than the contrast of a perfectly opaque spot defect. Point 788 represents the measured diameter of a semi-transparent spot defect that has a measured diameter of approximately 0.2 microns. Its contrast is approximately 30 percent. However, this measured diameter and contrast are somewhat lower than they should be due to the blurring effect and the semi-transparency of the spot defect. By taking into account these measured values and opacity curve data for a truly opaque spot defect, the present invention is able to determine the percentage opacity of the spot defect and thus correct measured dimensions of the defect.

A variety of techniques may be used to solve for the opacity of the spot defect using the above information. By way of example, FIG. 16 illustrates one embodiment that solves empirically for the opacity. In this embodiment of the invention, a measured spot defect that produces point 788 has its opacity adjusted until it falls at point 790 on the opacity curve. An adjusted opacity that produces point 790 is then determined as the correct opacity of the spot defect. Solving for the opacity given the above information can also be done analytically or using other similar techniques.

Figure 17:
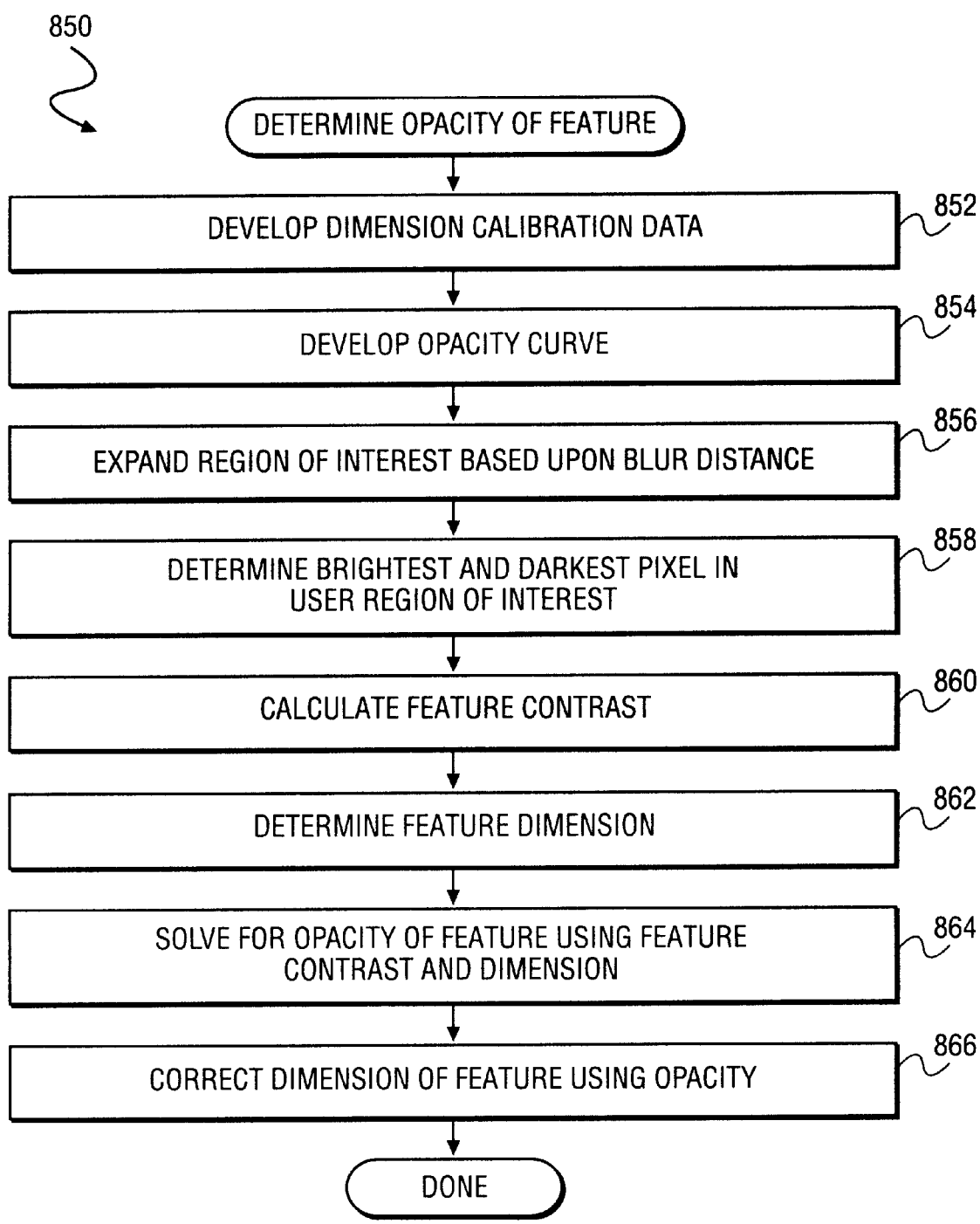
FIG. 17 is a flow diagram illustrating a second embodiment by which the opacity of a feature is determined.

FIG. 17 is a flowchart 850 illustrating the second embodiment by which the opacity of a feature is determined and thus a dimension of the feature can be corrected. In step 852 calibration data for adjusting a measured dimension of the feature is developed for use in compensating for lens optics, machine characteristics, blurring, etc. In a preferred embodiment of the invention, this step is performed as described in FIG. 4 of U.S. Pat. No. 5,966,677 and allows a measured value in pixels to be converted to a correct value in microns.

Step 854 develops opacity data for use in determining the opacity of the feature. This opacity data may appear in an opacity curve as shown in FIG. 16. To develop this opacity data, one or more circular opaque features of different diameters each have their contrasts measured. Advantageously, only one feature need be measured and the opacity curve can be developed from this single point. Measuring only one data point speeds up the process.

A formula may then used to develop the opacity curve based upon the single data point. A different formula may be used for different types of features, although the same formula may also be used. The formula used for lines calculates diameter from contrast (Contrast) and the blur distance (BlurPix—formula provided below) based upon the pseudocode below:

```
LogContr=log(1.0−Contrast)/Log(0.5);
    if (Contrast<0.5){
       diameter=BlurPix*sqrt(LogContr);
    } else {
       diameter=BlurPix*(1+LogContr)/2.;
    }
```

Because the shape of the opacity curve is known, only one data point is needed to correctly place the curve spatially in two dimensions. The formula provides this information, and thus allows future calculations for any point on the curve.

In an optional embodiment, a contrast-diameter lookup table may be used to store data represented in the curve. Thus, the opacity data (as represented on the opacity curve)

provides the percentage contrast for a feature of any size that is truly opaque. As will be described below, this data is useful for determining the opacity of features that are less than perfectly opaque. In one embodiment of the invention, step 854 develops a different opacity curve for each type of feature. Preferably, a different curve is developed for spots than for holes, for example. Different tables are developed because some cameras are not linear and have more gain in dark or bright areas. If the camera is linear, the two tables may be the same.

Next, a region of interest is developed around the feature to be measured. In a preferred embodiment of the invention, the region of interest is developed as described above and in U.S. Pat. No. 5,966,677. Briefly, video inspection machine 32 is used to identify a particular feature on a mask whose dimension and opacity is to be determined. In a preferred embodiment, system 30, as part of the mask production process, automatically identifies features to be measured. In another embodiment, a feature to be measured may be identified manually by the operator. Once a feature is detected, the inspection machine enters review mode and the video image of the feature site is displayed on the monitor of the computer.

Figure 18:
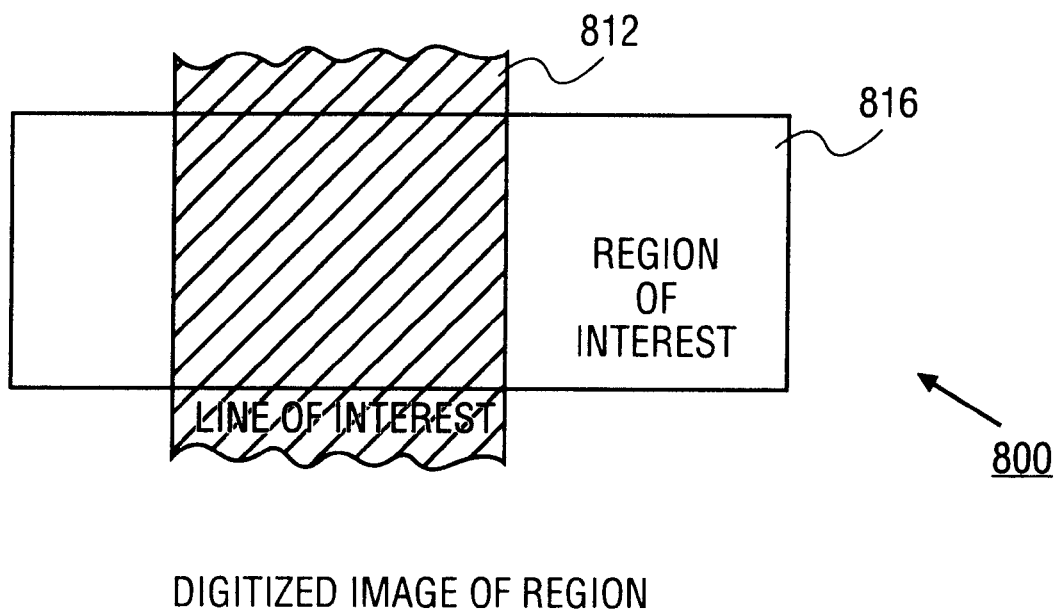
FIG. 18 is a digitized image of a region to be analyzed.

FIG. 18 is a digitized image 800 of a region to be analyzed. In this example, a photographic mask used in semiconductor manufacturing is being analyzed, although other media may also be analyzed. Included upon the mask is a line of interest 812 whose width is to be measured. A feature other than a line may have its width or height measured. A region of interest 816 encompasses the line to be measured 812.

In step 856 this region of interest is expanded horizontally in both directions based upon the blur distance of the lens. I.e., the region of interest is expanded in each direction by one blur distance. The blur distance is preferably calculated by using the below formula written in pseudocode. The blur distance (BlurPix) is calculated from the contrast and diameter of a particular feature, and assumes that the feature is of chrome. Preferably, the feature used is a circular defect with a size close to (i.e., within 30%) the blur distance or the wavelength used. The formula used is:

LogContr=Log(1−Contrast)/Log(0.5)
    If Contrast<0.5 Then
        BlurPix=diameter/Sqr(LogContr)
    Else
        BlurPix=diameter*2/(1+LogContr)
    End If Through this technique, the blur distance is much more precise and yields a better eventual measurement of a dimension.

Expanding the region of interest compensates for the smearing effect caused by very small features having a size close to the wavelength of the examining radiation. In a preferred embodiment of the invention, the region is expanded in each direction by one blur distance. Each lens may have a particular value of a blur distance associated with it. In step 858 the intensity values for the brightest and darkest pixel in this expanded region of interest are determined by looping through each pixel, checking for the minimum and maximum.

Step 860 calculates the feature contrast within this region preferably by subtracting the dark pixel value from the bright pixel value and dividing the result by the image intensity range. Preferably, the image intensity range for the region is determined as described in U.S. Pat. No. 5,966,677. For those features that are less than perfectly opaque, the calculated feature contrast value will be less than what might be expected. Alternatively, determination of the contrast may be determined by fitting the intensity profile of the feature to a Gaussian.

Step 862 determines the width of line 812 or the diameter of the feature (or other dimension). Determining the feature dimension may be performed in a variety of ways similar to those described in the present application. The feature dimension may be determined using the flux-area technique as described in U.S. Pat. No. 5,966,677. Alternatively, the third embodiment described below in FIGS. 19–21 may be used. It should be appreciated that step 862 could also be performed earlier in the overall process.

For features that are perfectly opaque, it is expected that the determined dimension and the calculated feature contrast will produce a data point that lies on or very near to the data represented in the opacity curve of FIG. 16. For those features that are less than perfectly opaque, it is expected that such a data point will lie off of the opacity curve, for example, point 788.

Step 864 solves for the opacity of the feature using the previously calculated feature contrast, the dimension determined from step 862 and the previously mentioned formula from step 854. It should be appreciated that at this point opacity may be solved for using other techniques using the information at hand. By way of example, opacity may be determined empirically using Newton's method.

Using Newton's method, opacity is determined as follows. Because the opacity of the feature is less than 100%, its contrast will be less than expected. Also, its measured dimension will be less than expected because the semi-transparency of the feature allows more flux to reach the optics, resulting in a smaller calculated dimension. Thus, a data point based upon the two would not necessarily fall upon the opacity curve of FIG. 16. Given a data point off of the curve, one may empirically take guesses at the percentage opacity of the feature to see which would have resulted in the data point falling on the curve. Once a correction for an opacity value has been found that places the data point on the opacity curve, the correct opacity has been determined. As mentioned above, this iterative process is preferably performed using Newton's method and the opacity data developed in step 854.

Once the opacity of the feature has been determined, then step 866 corrects the measured dimension of the feature. Preferably, a correct area is determined by dividing the measured area by the opacity, and the correct diameter is then determined by dividing the measured diameter by the square root of the opacity. For a measured height, its value may be corrected by dividing the measured height by the opacity. For a line width, its value is corrected in the same way.

DIMENSION DETERMINATION USING PEAK WIDTH

Figure 19:
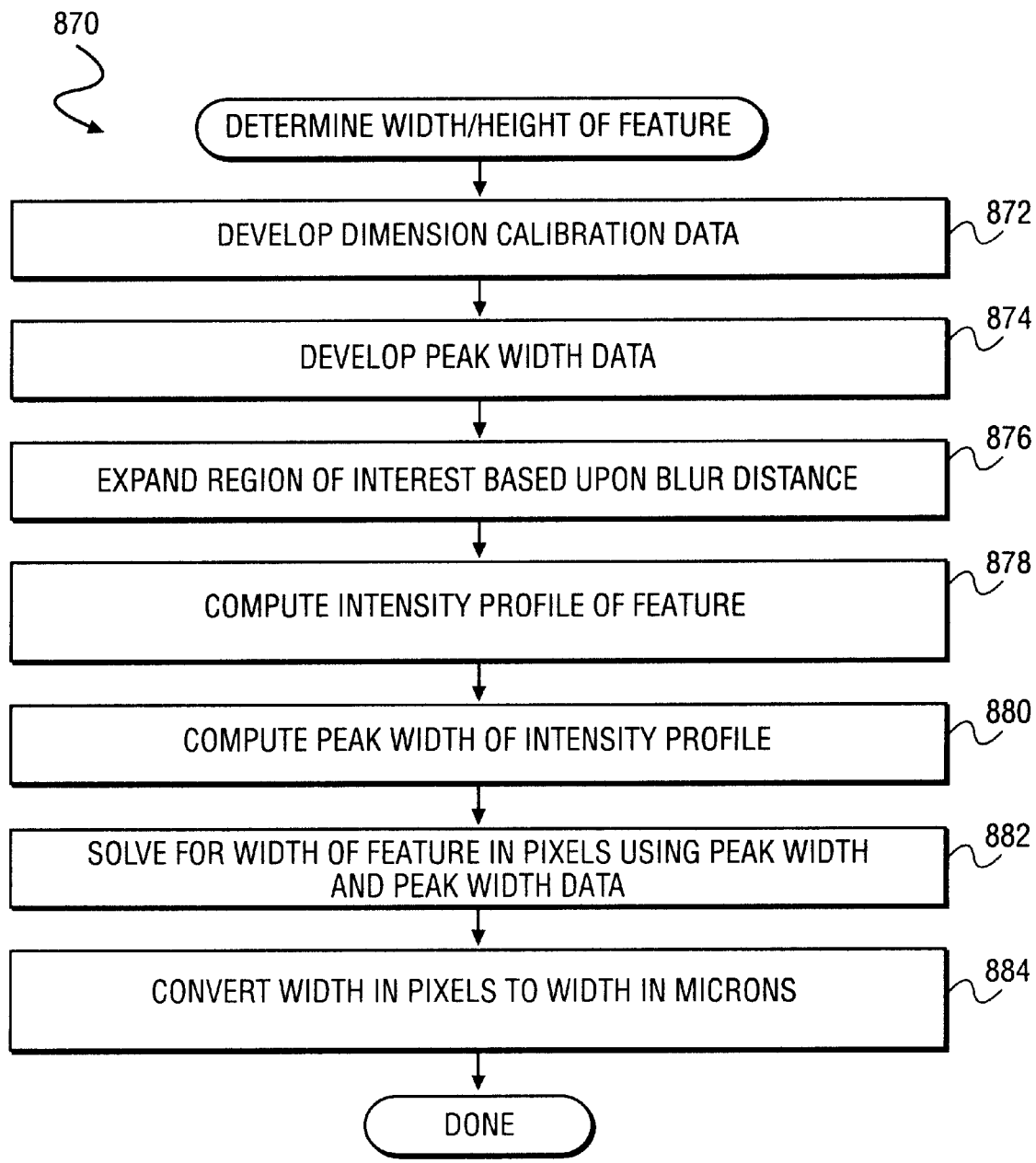
FIG. 19 is a flow diagram illustrating a technique for determining the width or height of a feature according to a third embodiment of the present invention.

FIG. 19 is a flowchart 870 illustrating a technique for determining the width or height of a feature that may not necessarily be circular according to a third embodiment of the present invention. The following description assumes that a width is being calculated, although height may be obtained by analyzing the feature in question from view point 90 degrees off. As an optional step, in step 872 calibration data for adjusting a measured dimension of the feature is developed for use in compensating for lens optics, machine characteristics, blurring, etc. This step may be performed as described in FIG. 5 of U.S. Pat. No. 5,966,677 and allows a measured value in pixels to be converted to a correct value in microns. Preferably, only one data point need be calculated as described.

Figure 20:
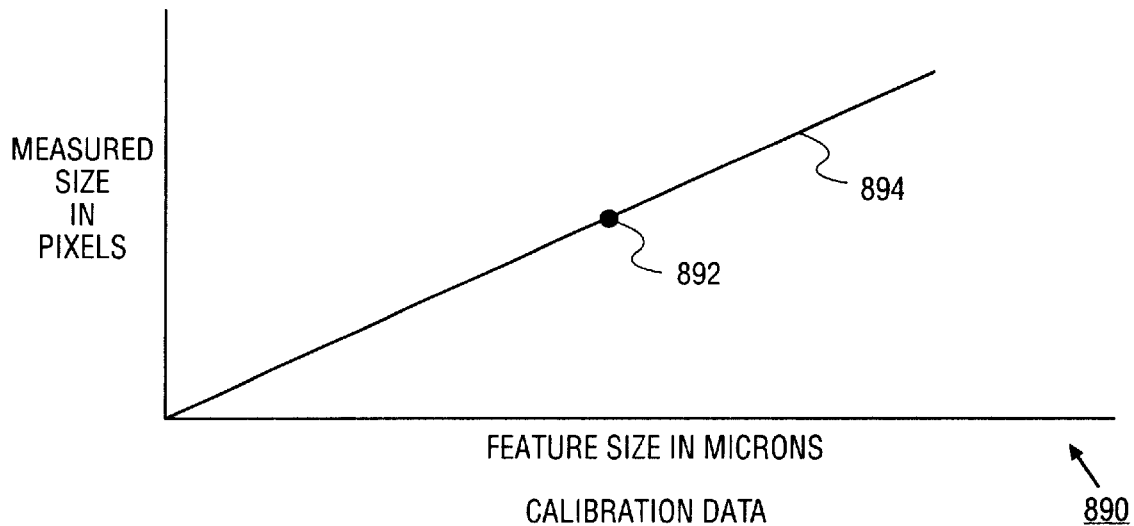
FIG. 20 is a graph showing calibration data for measured features.

FIG. 20 is a graph 890 showing calibration data for measured features. A single data point 892 is calculated as described in FIG. 5 of U.S. Pat. No. 5,966,677. Assuming then that the curve is linear, a line 894 can be plotted from the origin through data point 892. The slope of the line (pixels per micron) then provides a scale factor for final calibration of a measured result.

Figure 21:
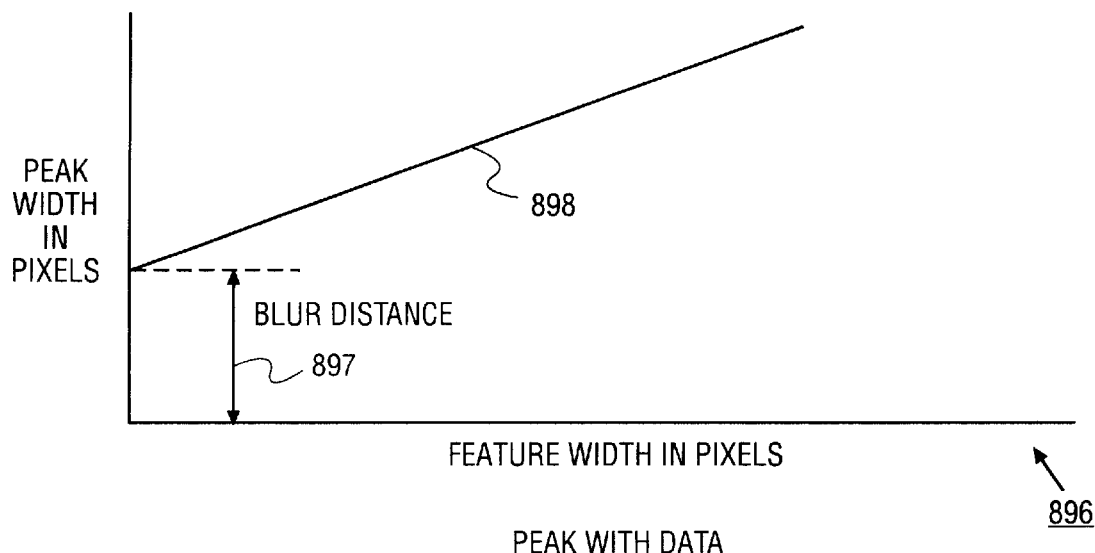
FIG. 21 is a graph of peak width versus feature width.

Step 874 develops peak width data for later use in determining the width of the feature. This peak width data may be plotted in a graph as shown in FIG. 21. FIG. 21 is a graph 896 of peak width versus feature width. Using blur distance 897 that was previously calculated in the formula above a point on the vertical axis is determined. Line 898 then extends from the vertical axis from this point and its slope may be determined by the formula below in step 882 which calculates feature width from the peak width.

Next, a region of interest is developed around the feature to be measured. In a preferred embodiment of the invention, the user region of interest is developed as described above. In step 876 this region of interest is expanded in each direction horizontally by one blur distance. Step 878 computes an intensity profile for the feature. An intensity profile may be computed in many ways. In a preferred embodiment of the invention, the profile is computed as described above or as in U.S. Pat. No. 5,966,677.

Step 880 computes the peak width of the intensity profile. Preferably, first the mean position is calculated from the intensity profile. The standard deviation of the peak width is calculated from the mean. The peak width can be calculated by multiplying the standard deviation by a constant. Alternatively, determination of the peak width may be determined by fitting the profile to a Gaussian.

Step 882 solves for the width of the feature in pixels using the standard deviation of the peak width (dStdev) calculated in step 880 and the blur distance (BlurPix) calculated above using the below formula.

$$\text{FeatureWidth} = 2.5 * ((dStdev * 2.7) - BlurPix)$$

In this embodiment, the values 2.7 and 2.5 are empirically derived. They express the relation between measuring a gaussian's width using the full-width half-maximum (FWHM) and standard deviation methods. The standard deviation method is preferred as it is more noise-resistant. Step 884 converts this width in pixels to a width in microns using the scale factor developed in step 872. Advantageously, this embodiment of the present invention allows for the calculation of width for features that are close to the wavelength being used or less.

COMPUTER SYSTEM EMBODIMENT

FIGS. 22A and 22B illustrate a computer system 900 suitable for implementing embodiments of the present invention. FIG. 22A shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 22B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

Although the foregoing invention has been described in some detail for purposes of clarity of understanding, it will be apparent that certain changes and modifications may be practiced within the scope of the appended claims. For example, the video image input may come from a wide variety of sources. Also, measurements may be taken of a variety of features at the micron level that are present on a variety of media, and not necessarily a photographic mask. For example, the invention is applicable to biological specimens such as cells. Also, any type of light microscopic may be used as well as an electron microscope or other particle microscope. Therefore, the described embodiments should be taken as illustrative and not restrictive, and the invention should not be limited to the details given herein but should be defined by the following claims and their full scope of equivalents.

I claim:

1. A method of measuring a dimension of a microscopic feature in the presence of an interfering feature, the distance between said feature to be measured and said interfering feature is less than about 1.5 times the wavelength used to measure said feature, said method comprising:

receiving an image of a region of interest, said region of interest including an image of said feature to be measured and an image of an edge of said interfering feature;

determining an intensity profile for said region of interest;

calculating estimated edge positions for the edges of said feature to be measured and said interfering feature;

creating a simulated intensity profile for said region of interest based upon said estimated edge positions;

determining an error intensity profile representing the difference between said intensity profile and said simulated intensity profile; and calculating new estimated edge positions using said error intensity profile, whereby the dimension of said microscopic feature may be calculated using said new estimated edge positions.

2. A method as recited in claim 1 further comprising repeating the following until an error is acceptable:

recreating a simulated intensity profile for said region of interest based upon said newly calculated estimated edge positions;

determining an error intensity profile representing the difference between said intensity profile and said recreated simulated intensity profile; and calculating new estimated edge positions using said error intensity profile.

3. A method as recited in claim 1 wherein said element of creating a simulated intensity profile includes the sub-steps of:

convolving reference edge profiles to obtain an individual simulated profile for each of said feature to be measured and for said interfering feature; and adding said individual simulated profiles of said feature and said interfering feature to create said simulated intensity profile.

4. A method as recited in claim 1 further comprising:

creating a simulated interfering edge profile;

subtracting said simulated interfering edge profile from said intensity profile to obtain an isolated intensity profile of said feature to be measured; and determining said dimension of said feature to be measured using said isolated intensity profile.

5. A method as recited in claim 1 wherein said feature is a line and said dimension is the width of said line.

6. A method as recited in claim 1 wherein said feature is present on a mask used to manufacture a semiconductor device.

7. A method of measuring a dimension of a microscopic feature in the presence of an interfering feature, the distance between said feature to be measured and said interfering feature is less than about 1.5 times the wavelength used to measure to said feature, said method comprising:

receiving an intensity profile for a region of interest, said region of interest including an image of said feature to be measured and an image of an edge of said interfering feature;

estimating edge positions for the edges of said feature to be measured and said interfering feature;

creating a simulated intensity profile for said region of interest based upon said estimated edge positions;

calculating edge positions errors for the edges of said feature to be measured and said interfering feature using said intensity profile and said simulated intensity profile; and calculating new estimated edge positions using said edge positions errors, whereby the dimension of said microscopic feature may be calculated using said new estimated edge positions.

8. A method as recited in claim 7 further comprising repeating the following until said edge positions errors are acceptable:

recreating a simulated intensity profile for said region of interest based upon said newly calculated estimated edge positions;

recalculating edge positions errors for the edges of said feature to be measured and said interfering feature using said intensity profile and said recreated simulated intensity profile; and calculating new estimated edge positions using said edge positions errors.

9. A method as recited in claim 7 wherein said element of creating a simulated intensity profile includes the sub-steps of:

convolving reference edge profiles to obtain an individual simulated profile for each of said feature to be measured and for said interfering feature; and adding said individual simulated profiles of said feature and said interfering feature to create said simulated intensity profile.

10. A method as recited in claim 7 further comprising:

creating a simulated interfering edge profile;

subtracting said simulated interfering edge profile from said intensity profile to obtain an isolated intensity profile of said feature to be measured; and determining said dimension of said feature to be measured using said isolated intensity profile.

11. A method as recited in claim 7 wherein said feature is a line and said dimension is the width of said line.

12. A method as recited in claim 7 wherein said feature is present on a mask used to manufacture a semiconductor device.

13. A mask used in the manufacture of semiconductor devices, said mask resulting from a method of measuring a dimension of a microscopic feature in the presence of an interfering feature, wherein said method is as recited in any of claims 1 through 12.

14. A semiconductor device, said semiconductor device resulting from a method of measuring a dimension of a microscopic feature in the presence of an interfering feature on a mask, wherein said method is as recited in any of claims 1 through 12.

* * * * *